United States Patent
Radulescu et al.

(10) Patent No.: US 9,536,783 B2
(45) Date of Patent: Jan. 3, 2017

(54) WAFER-LEVEL DIE ATTACH METALLIZATION

(71) Applicant: Cree, Inc., Durham, NC (US)

(72) Inventors: Fabian Radulescu, Chapel Hill, NC (US); Helmut Hagleitner, Zebulon, NC (US); Terry Alcorn, Cary, NC (US); William T. Pulz, Cary, NC (US); Van Mieczkowski, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/591,566

(22) Filed: Jan. 7, 2015

(65) Prior Publication Data

US 2015/0140806 A1    May 21, 2015

Related U.S. Application Data

(62) Division of application No. 13/834,196, filed on Mar. 15, 2013, now Pat. No. 8,970,010.

(51) Int. Cl.
   *H01L 21/283*    (2006.01)
   *H01L 23/522*    (2006.01)
   (Continued)

(52) U.S. Cl.
   CPC ... *H01L 21/76897* (2013.01); *H01L 21/32133* (2013.01); *H01L 21/32139* (2013.01);
   (Continued)

(58) Field of Classification Search
   None
   See application file for complete search history.

(56) References Cited

U.S. PATENT DOCUMENTS 3,761,782 A * 9/1973 Youmans .............. H01L 21/764
                                                      148/DIG. 115
5,767,447 A    6/1998 Dudderar et al.
(Continued)

OTHER PUBLICATIONS

Notice of Allowance for U.S. Appl. No. 13/724,426 mailed Feb. 13, 2014, 8 pages.
(Continued)

*Primary Examiner* — Pamela E Perkins
(74) *Attorney, Agent, or Firm* — Anthony J. Josephson

(57) ABSTRACT

Embodiments of a semiconductor wafer having wafer-level die attach metallization on a back-side of the semiconductor wafer, resulting semiconductor dies, and methods of manufacturing the same are disclosed. In one embodiment, a semiconductor wafer includes a semiconductor structure and a front-side metallization that includes front-side metallization elements for a number of semiconductor die areas. The semiconductor wafer also includes vias that extend from a back-side of the semiconductor structure to the front-side metallization elements. A back-side metallization is on the back-side of the semiconductor structure and within the vias. For each via, one or more barrier layers are on a portion of the back-side metallization that is within the via and around a periphery of the via. The semiconductor wafer further includes wafer-level die attach metallization on the back-side metallization other than the portions of the back-side metallization that are within the vias and around the peripheries of the vias.

8 Claims, 26 Drawing Sheets

(51) Int. Cl.
*H01L 21/768* (2006.01)
*H01L 23/532* (2006.01)
*H01L 23/48* (2006.01)
*H01L 23/488* (2006.01)
*H01L 23/00* (2006.01)
*H01L 21/3213* (2006.01)

(52) U.S. Cl.
CPC .. *H01L 21/76841* (2013.01); *H01L 21/76877* (2013.01); *H01L 21/76895* (2013.01); *H01L 23/481* (2013.01); *H01L 23/488* (2013.01); *H01L 23/53247* (2013.01); *H01L 23/53252* (2013.01); *H01L 24/02* (2013.01); *H01L 24/03* (2013.01); *H01L 24/27* (2013.01); *H01L 24/29* (2013.01); *H01L 24/83* (2013.01); *H01L 24/94* (2013.01); *H01L 24/05* (2013.01); *H01L 24/32* (2013.01); *H01L 2224/0233* (2013.01); *H01L 2224/0239* (2013.01); *H01L 2224/02313* (2013.01); *H01L 2224/02331* (2013.01); *H01L 2224/02371* (2013.01); *H01L 2224/0345* (2013.01); *H01L 2224/0346* (2013.01); *H01L 2224/0361* (2013.01); *H01L 2224/04026* (2013.01); *H01L 2224/0557* (2013.01); *H01L 2224/05548* (2013.01); *H01L 2224/05644* (2013.01); *H01L 2224/26145* (2013.01); *H01L 2224/2746* (2013.01); *H01L 2224/2747* (2013.01); *H01L 2224/2761* (2013.01); *H01L 2224/2908* (2013.01); *H01L 2224/29011* (2013.01); *H01L 2224/29083* (2013.01); *H01L 2224/29111* (2013.01); *H01L 2224/29144* (2013.01); *H01L 2224/32238* (2013.01); *H01L 2224/83191* (2013.01); *H01L 2224/83201* (2013.01); *H01L 2224/83203* (2013.01); *H01L 2224/83815* (2013.01); *H01L 2224/83897* (2013.01); *H01L 2224/94* (2013.01); *H01L 2924/01322* (2013.01); *H01L 2924/12032* (2013.01); *H01L 2924/13064* (2013.01); *H01L 2924/13091* (2013.01)

(56) References Cited

U.S. PATENT DOCUMENTS

| | | | |
|---|---|---|---|
| 6,370,034 | B1 | 4/2002 | Busch |
| 6,856,004 | B2 | 2/2005 | Kiaei et al. |
| 7,265,052 | B2 | 9/2007 | Sinha |
| 7,282,804 | B2 | 10/2007 | Lee |
| 7,608,485 | B2 | 10/2009 | Hong et al. |
| 8,138,087 | B2 | 3/2012 | Morel et al. |
| 2004/0212034 | A1* | 10/2004 | Mochizuki ......... H01L 27/0823 257/502 |
| 2009/0302478 | A1 | 12/2009 | Pagaila et al. |
| 2010/0109114 | A1 | 5/2010 | Izumi |
| 2011/0042803 | A1 | 2/2011 | Chu |
| 2012/0175764 | A1 | 7/2012 | Behammer et al. |
| 2012/0267773 | A1 | 10/2012 | Ebefors et al. |
| 2013/0115730 | A1 | 5/2013 | El-Gamal et al. |
| 2013/0256841 | A1 | 10/2013 | Mieczkowski et al. |
| 2013/0277845 | A1 | 10/2013 | Chen et al. |
| 2014/0054597 | A1 | 2/2014 | Ritenour et al. |

OTHER PUBLICATIONS

Non-final Office Action for U.S. Appl. No. 13/724,426 mailed Jun. 25, 2014, 8 pages.
Non-final Office Action for U.S. Appl. No. 13/834,196 mailed May 27, 2014, 9 pages.
Notice of Allowance for U.S. Appl. No. 13/834,196, mailed Oct. 8, 2014, 9 pages.

* cited by examiner

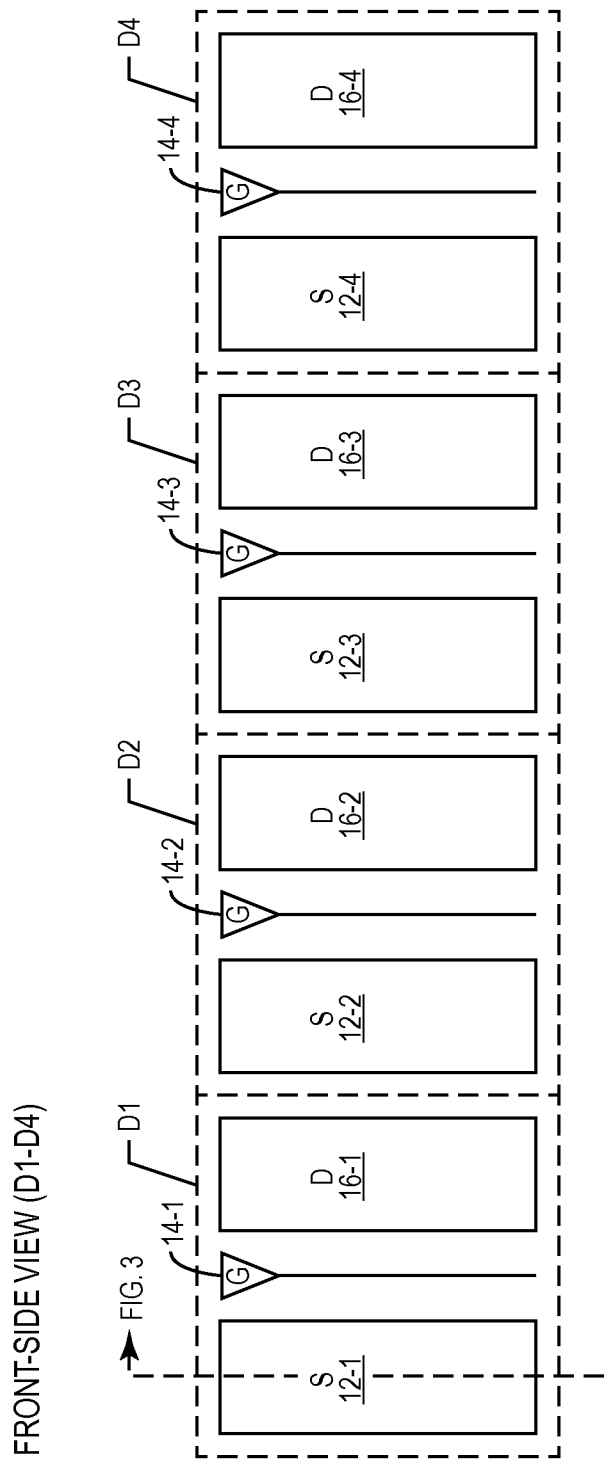

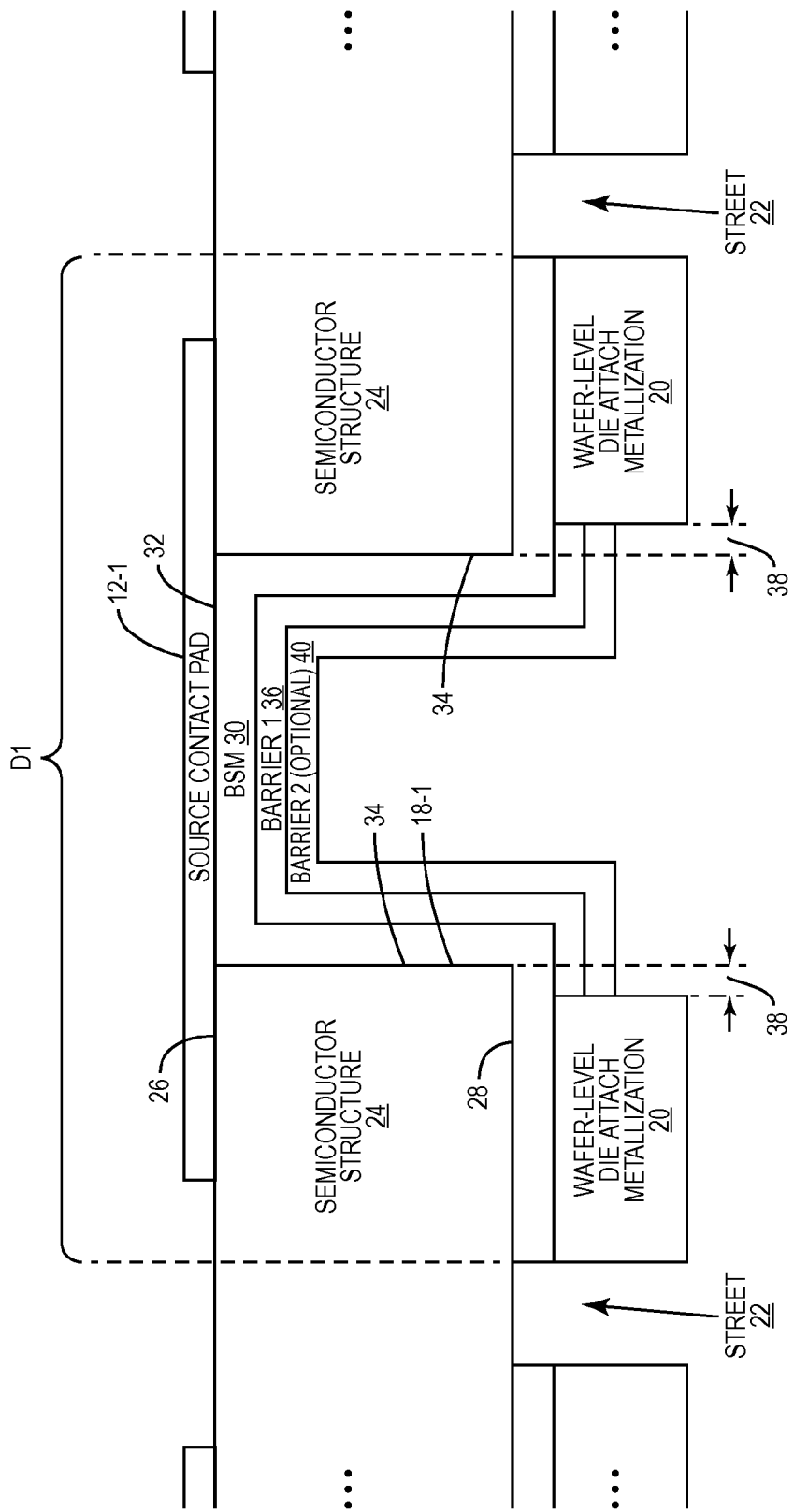

WAFER-LEVEL DIE ATTACH METALLIZATION

This application is a Division of U.S. utility patent application Ser. No. 13/834,196, filed Mar. 15, 2013, now U.S. Pat. No. 8,970,010, the disclosure of which is incorporated herein by reference in its entirety.

FIELD OF THE DISCLOSURE

The present disclosure relates to wafer-level die attach metallization for a semiconductor wafer.

BACKGROUND

In the manufacturing of semiconductor devices, vias are often used to interconnect back-side and front-side metallization. More specifically, lateral semiconductor devices can be radio or microwave frequency devices or power devices. Some examples are lateral High Electron Mobility Transistors (HEMTs), lateral Field Effect Transistors (FETs), lateral Metal-Oxide-Semiconductor Field Effect Transistors (MOSFETs), and lateral Schottky diodes. Using a lateral HEMT as an example, the HEMT includes a semiconductor structure that, in one particular implementation, includes a substrate (e.g., a Silicon Carbide (SiC), Silicon (Si), or sapphire substrate), a Gallium Nitride (GaN) base layer on the substrate, and an Aluminum Gallium Nitride (AlGaN) barrier layer on the GaN base layer. A front-side metallization is on a front-side of the semiconductor structure and includes a source contact pad, a gate contact pad, and a drain contact pad of the HEMT. In order to carry large currents and to dissipate heat, the HEMT may also include a back-side metallization that is electrically and thermally connected to the source contact by a via that extends from a back-side of the semiconductor structure to the front-side metallization on the front-side of the semiconductor structure.

SUMMARY

The present disclosure relates to wafer-level die attach metallization on a back-side of a semiconductor wafer. In one embodiment, a semiconductor wafer includes a semiconductor structure and a front-side metallization on a front-side of the semiconductor structure, wherein the front-side metallization includes front-side metallization elements for a number of semiconductor die areas of the semiconductor wafer. The semiconductor wafer also includes vias that extend from a back-side of the semiconductor structure to the front-side metallization elements of the front-side metallization on the front-side of the semiconductor structure. A back-side metallization is on the back-side of the semiconductor structure and within the vias such that, for each via, a portion of the back-side metallization is within the via and around a periphery of the via. For each via, the semiconductor wafer includes one or more barrier layers on the portion of the back-side metallization that is within the via and around the periphery of the via. The semiconductor wafer further includes wafer-level die attach metallization on the back-side metallization other than the portions of the back-side metallization that are within the vias and around the peripheries of the vias. Using wafer-level processing, both placement and dimensions of the wafer-level die attach metallization can be carefully controlled to prevent the wafer-level die attach metallization from entering the vias, or at least reduce a risk of the wafer-level die attach metallization entering the vias, during attachment of corresponding semiconductor dies to packages after dicing the semiconductor wafer.

In one embodiment, the semiconductor wafer further includes streets through the wafer-level die attach metallization and, in some embodiments, the back-side metallization to the back-side of the semiconductor structure. The streets correspond to cut-lines around peripheries of the semiconductor die regions at which the semiconductor wafer is to be cut during a dicing procedure to thereby provide the corresponding semiconductor dies.

In one embodiment, for each via, the one or more barrier layers include one or more diffusion barriers that prevent diffusion of metal from the wafer-level die attach metallization into the portion of the back-side metallization within the via and around the via during attachment of the corresponding semiconductor die to a package after dicing the semiconductor wafer. In another embodiment, for each semiconductor die region, the one or more barrier layers include one or more barrier layers that provide a surface tension that repels the wafer-level die attach metallization away from the via when the wafer-level die attach metallization is in either a liquid state or a combined liquid and solid state during attachment of the corresponding semiconductor die to a package after dicing the semiconductor wafer.

In one embodiment, the wafer-level die attach metallization is a eutectic metal alloy. In one particular embodiment, the eutectic metal alloy is Gold-Tin (AuSn) having a mixture of approximately 80% Au and approximately 20% Sn.

In one embodiment, a semiconductor die includes a semiconductor structure, a front-side metallization element on a front-side of the semiconductor structure, a via that extends from a back-side of the semiconductor structure to the front-side metallization element on the front-side of the semiconductor structure, a back-side metallization on the back-side of the semiconductor structure and within the via, one or more barrier layers on a portion of the back-side metallization that is within the via and around a periphery of the via, and a wafer-level die attach metallization on the back-side metallization laterally adjacent to the via. In one embodiment, the wafer-level die attach metallization thermally and electrically connects the semiconductor die to a mounting substrate of a package.

In one embodiment, a process for manufacturing a semiconductor wafer including a number of semiconductor die areas includes forming vias through a semiconductor structure of the semiconductor wafer from a back-side of the semiconductor structure to corresponding front-side metallization elements of the semiconductor die areas on a front-side of the semiconductor structure and forming a back-side metallization on the back-side of the semiconductor structure and within the vias such that, for each via, a portion of the back-side metallization is within the via and around a periphery of the via. The process further includes, for each via, providing one or more barrier layers on the portion of the back-side metallization that is within the via and around the periphery of the via. The process then includes forming a wafer-level die attach metallization on the back-side metallization other than the portions of the back-side metallization that are within the vias and around the peripheries of the vias.

In one embodiment, in order to provide the one or more barrier layers for each of the vias includes forming one or more barrier materials on the back-side metallization including the portions of the back-side metallization that are within the vias and around the peripheries of the vias, forming a mask on portions of the one or more barrier materials that are on the portions of the back-side metallization that are within the vias and around the peripheries of the vias, and etching the one or more barrier materials using the mask to thereby provide the one or more barrier layers for each of the vias. Still further, in one embodiment, forming the wafer-level die attach metallization includes forming the wafer-level die attach metallization on a portion of the back-side metallization exposed by the mask after etching the one or more barrier materials.

In one embodiment, the process for manufacturing the semiconductor wafer further includes forming streets through the wafer-level die attach metallization and, in some embodiments, the back-side metallization to the back-side of the semiconductor wafer around peripheries of the semiconductor die areas. In yet another embodiment, the process further includes cutting the semiconductor wafer along the streets to thereby dice the semiconductor wafer to provide a number of semiconductor dies that correspond to the semiconductor die areas of the semiconductor wafer.

In one embodiment, forming the wafer-level die attach metallization includes plating the wafer-level die attach metallization. In one embodiment, the wafer-level die attach metallization is a low melting point eutectic metal alloy. In one particular embodiment, the eutectic metal alloy is AuSn in a mixture of approximately 80% Au and approximately 20% Sn. In one embodiment, plating the wafer-level die attach metallization includes plating a low melting point eutectic mixture of a desired metal alloy. In one particular embodiment, the low melting point eutectic mixture of the desired metal alloy is an approximately 80% Au, 20% Sn mixture of AuSn. In another embodiment, forming the wafer-level die attach metallization includes forming an alternating series of one or more layers of a first metal in a desired metal alloy and one or more layers of a second metal in the desired metal alloy such that, when heated, the one or more layers of the first metal and the one or more layers of the second metal mix to provide a low melting point eutectic mixture of the desired metal alloy.

In one embodiment, a semiconductor wafer includes a semiconductor structure, a front-side metallization on a front-side of the semiconductor structure, a back-side metallization on a back-side of the semiconductor structure, a wafer-level die attach metallization on the back-side metallization, and streets through the wafer-level die attach metallization and, in some embodiments, the back-side metallization to the back-side of the semiconductor structure. The streets correspond to cut-lines at which the semiconductor wafer is to be cut to separate the semiconductor wafer into multiple semiconductor dies.

In another embodiment, a method of manufacturing a semiconductor wafer includes providing a semiconductor structure, forming a front-side metallization on a front-side of the semiconductor structure, forming a back-side metallization on a back-side of the semiconductor structure, and plating a low melting point eutectic mixture of a desired metal alloy on the back-side metallization to thereby provide a wafer-level die attach metallization on the back-side metallization.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A and 2B illustrate a front-side and a back-side, respectively, of a subset of the semiconductor die areas of the semiconductor wafer of FIG. 1 according to one embodiment of the present disclosure;

FIG. 3 illustrates a cross-section of one of the semiconductor die regions of FIGS. 2A and 2B according to one embodiment of the present disclosure;

Figure 1:
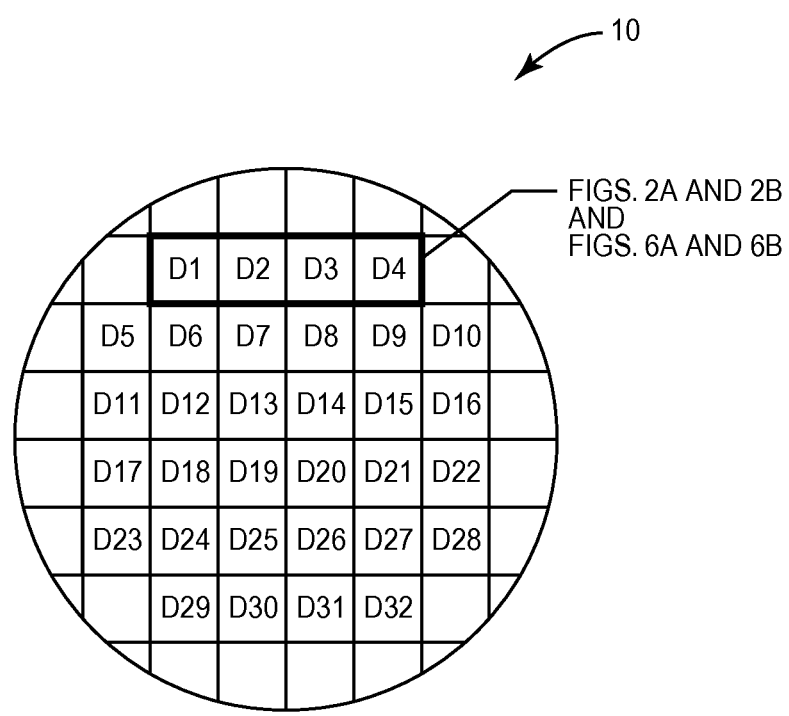
FIG. 1 illustrates a semiconductor wafer that includes multiple semiconductor die areas according to one embodiment of the present disclosure.
Figure 2B:
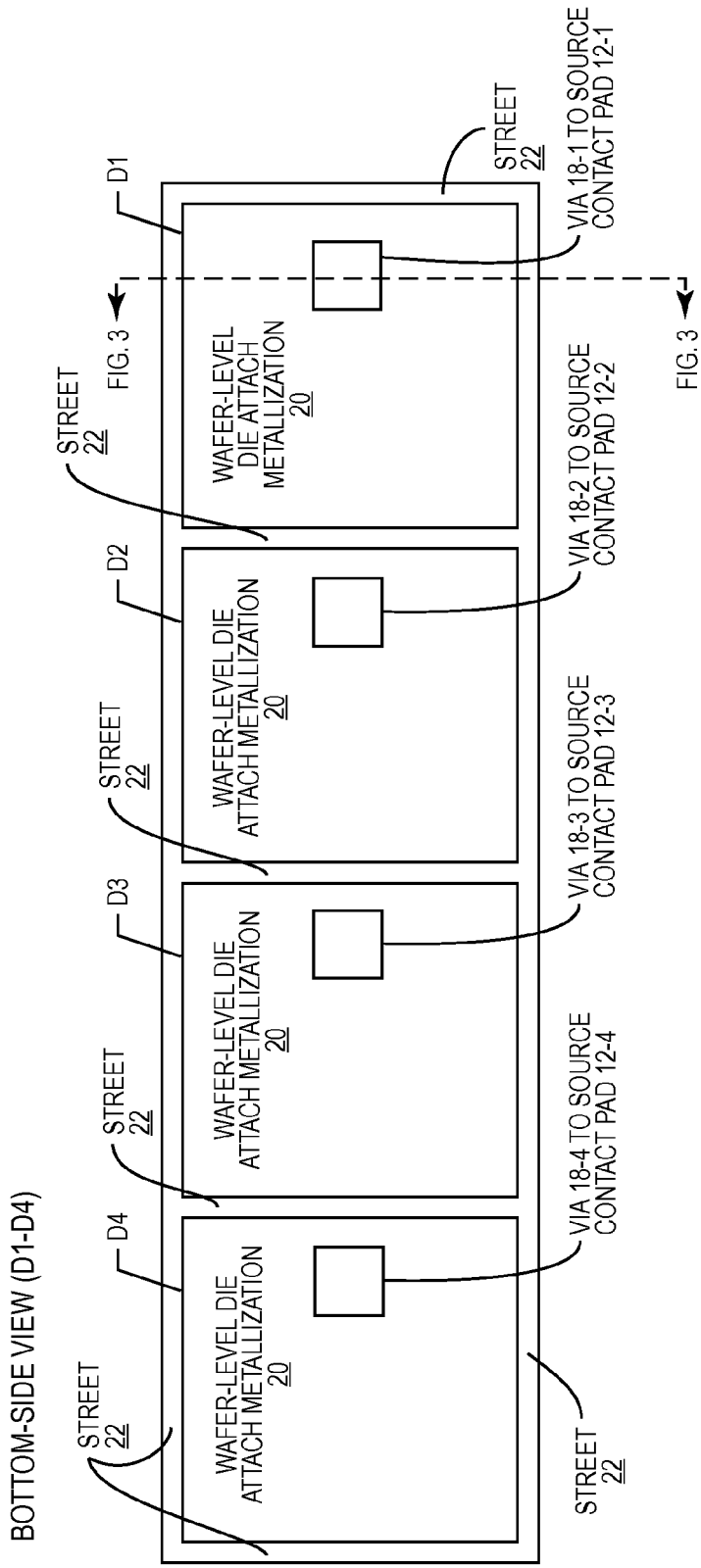
Figure 5:
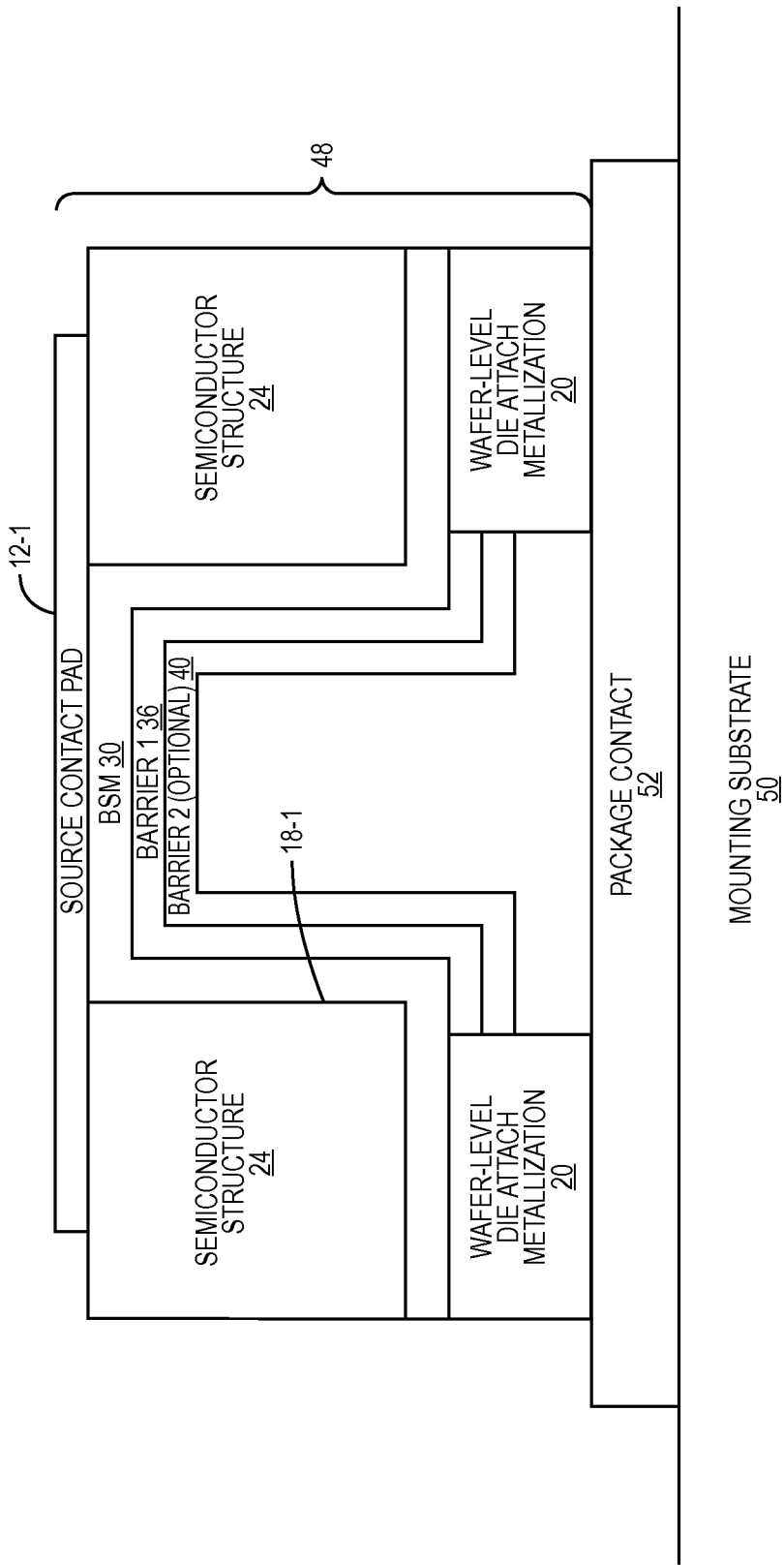
Figure 6A:
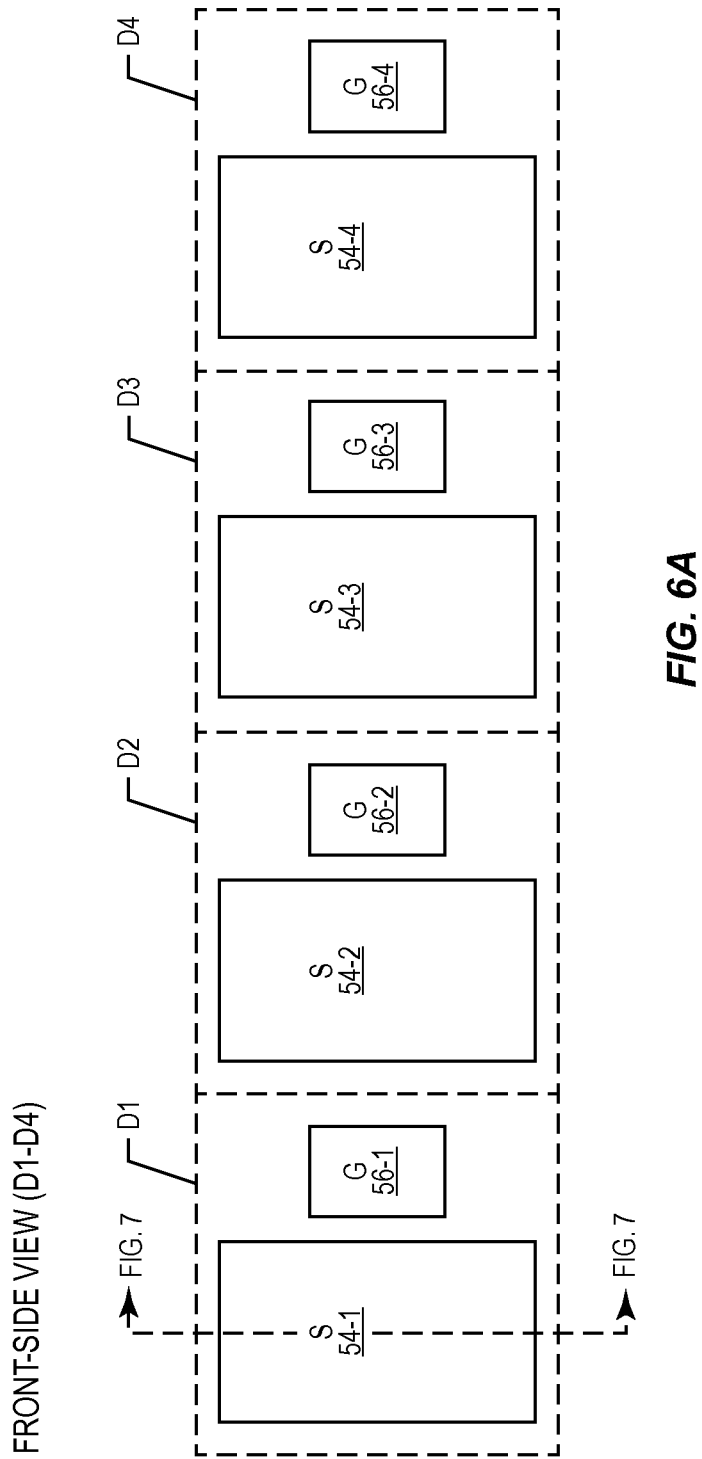
Figure 6B:
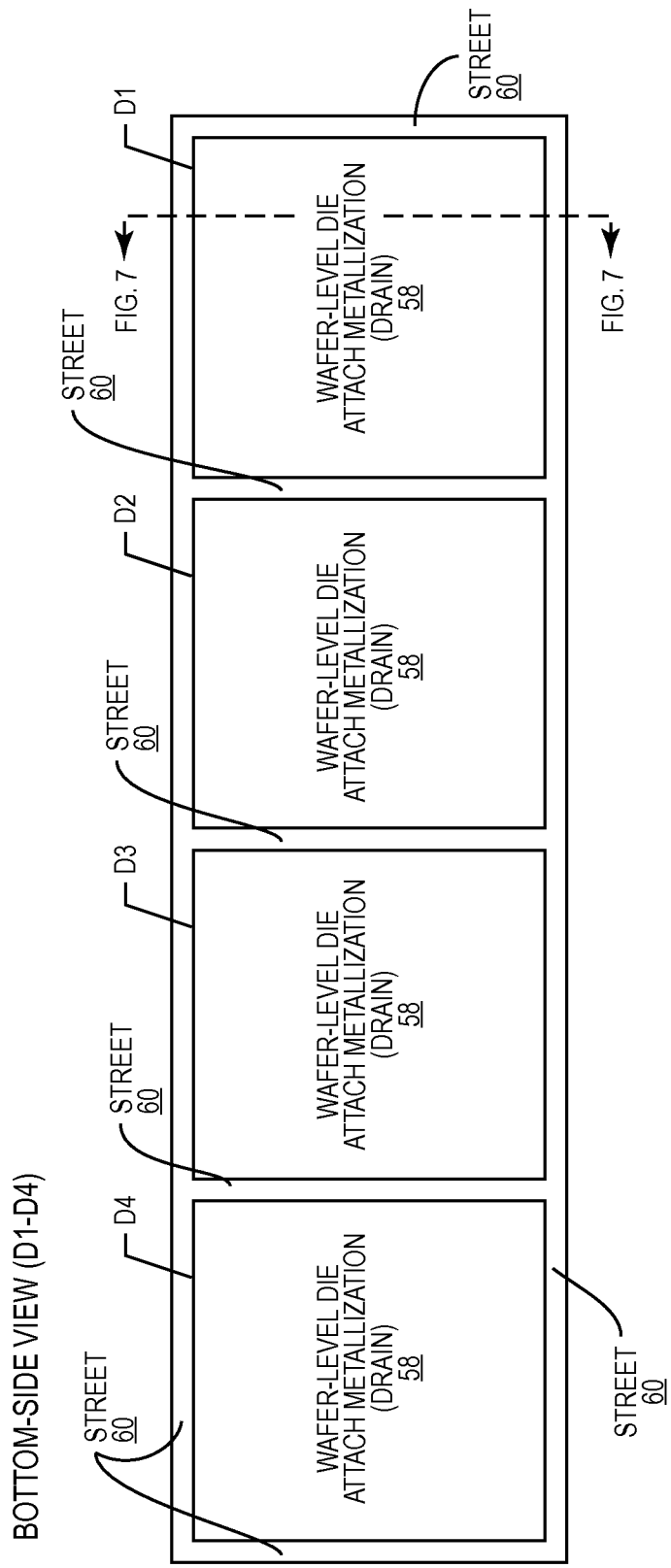
Figure 7:
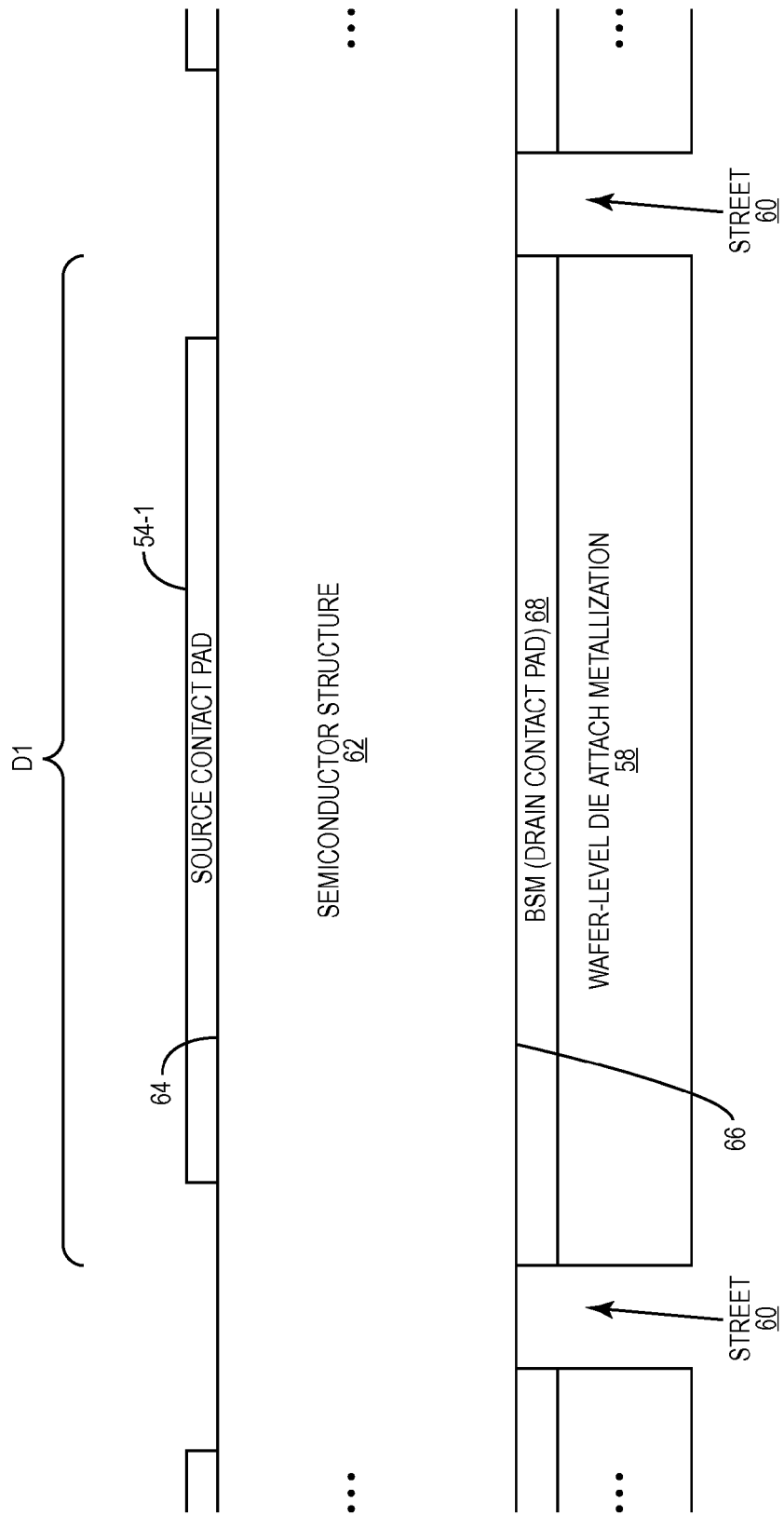
Figure 8A:
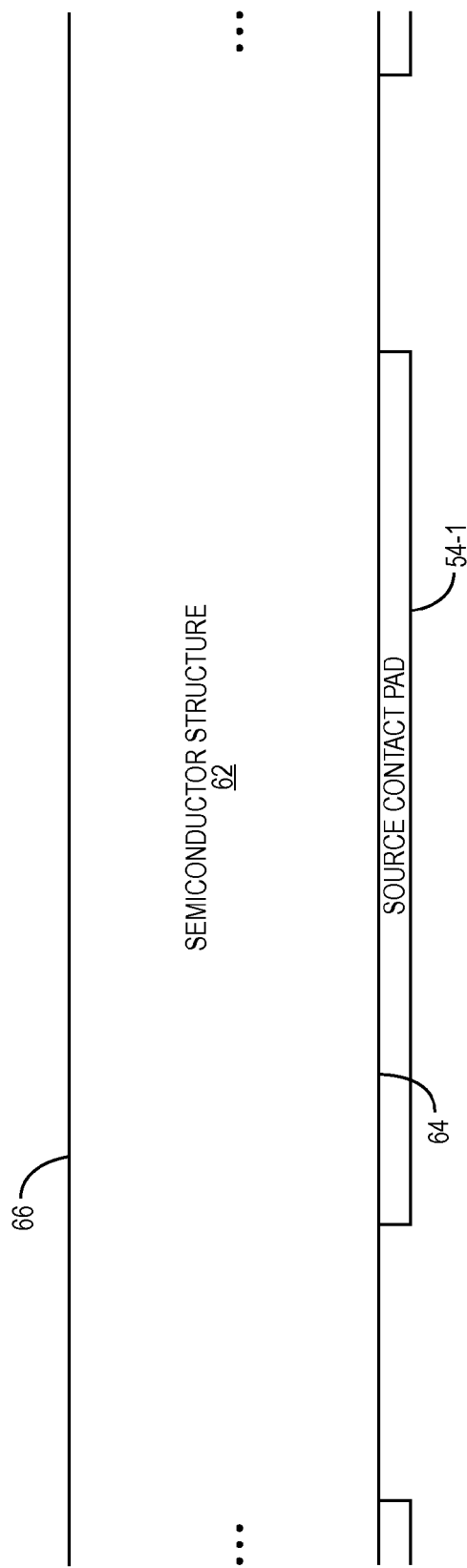
Figure 8B:
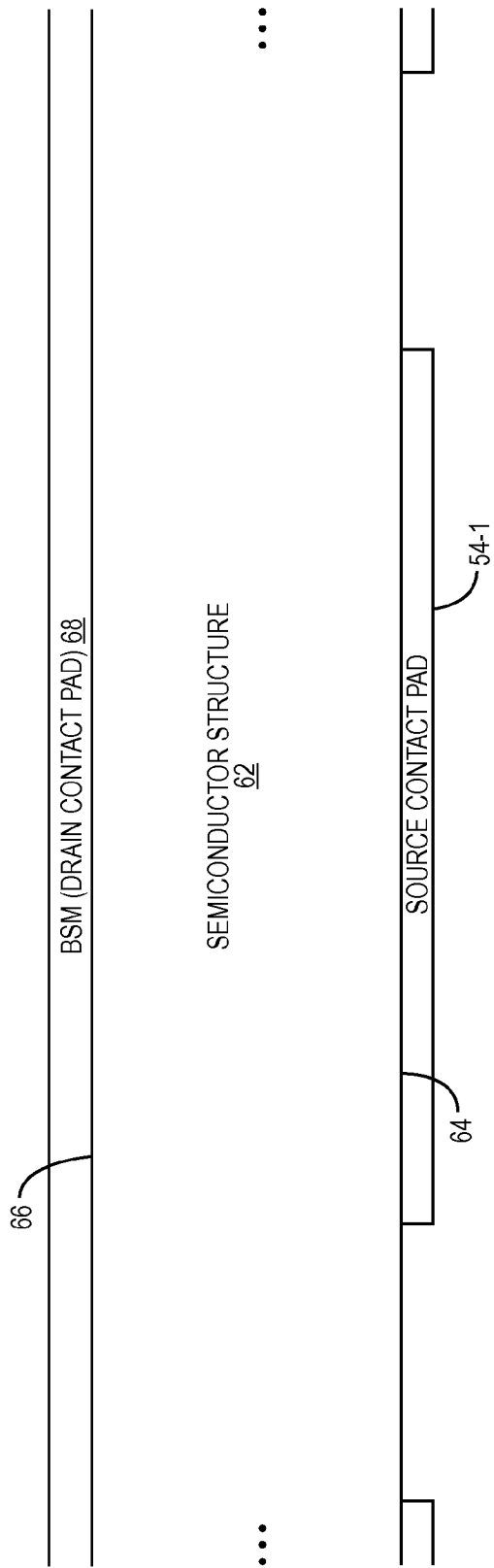
Figure 8C:
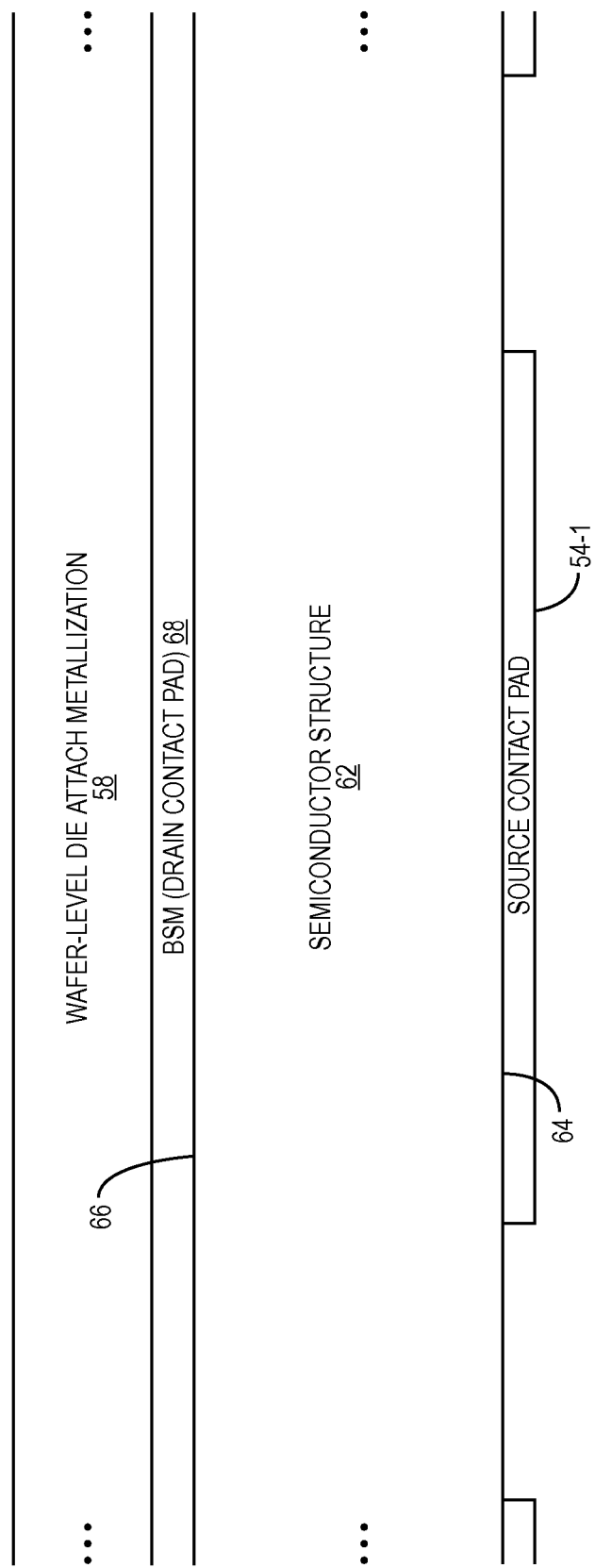
Figure 8D:
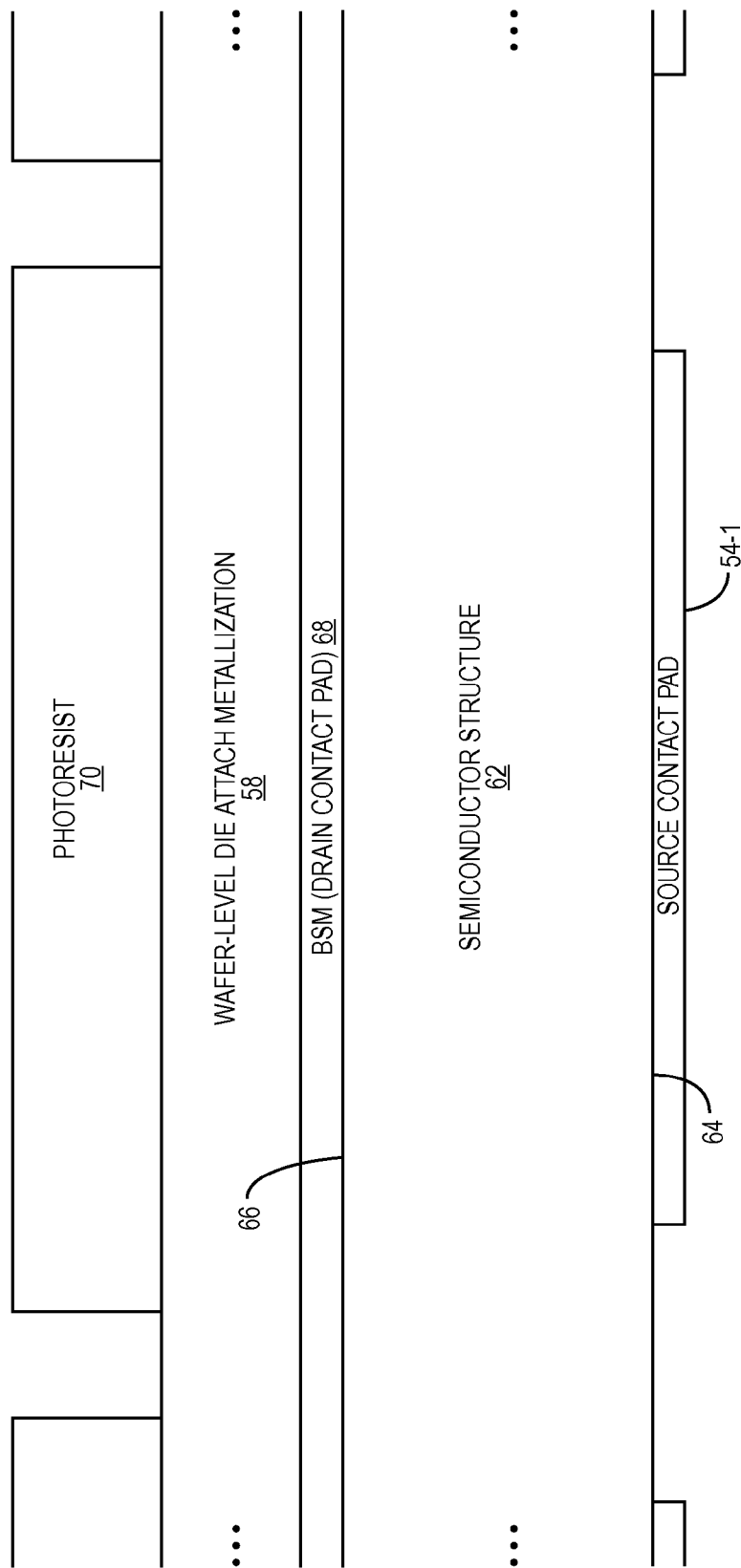
Figure 8E:
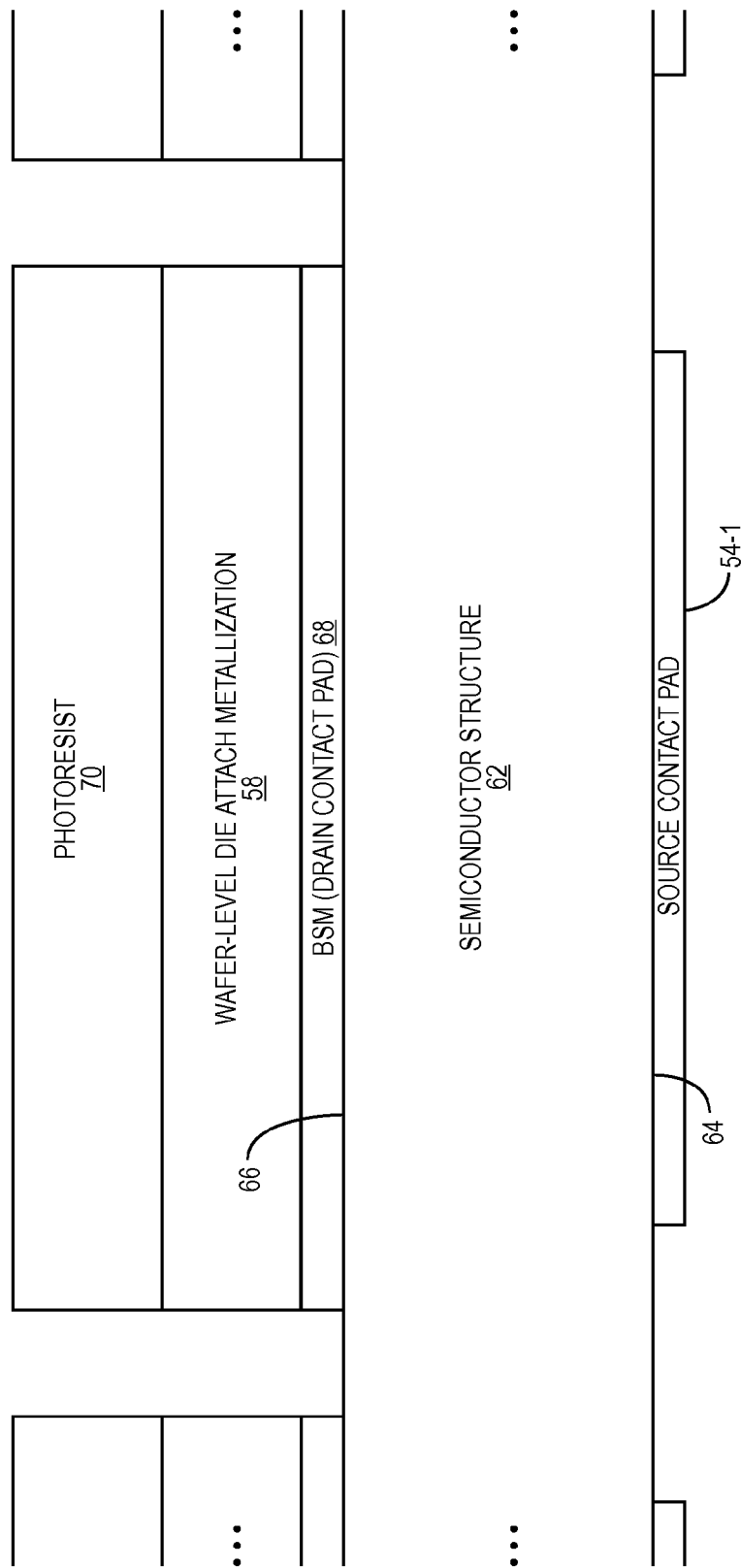
Figure 8F:
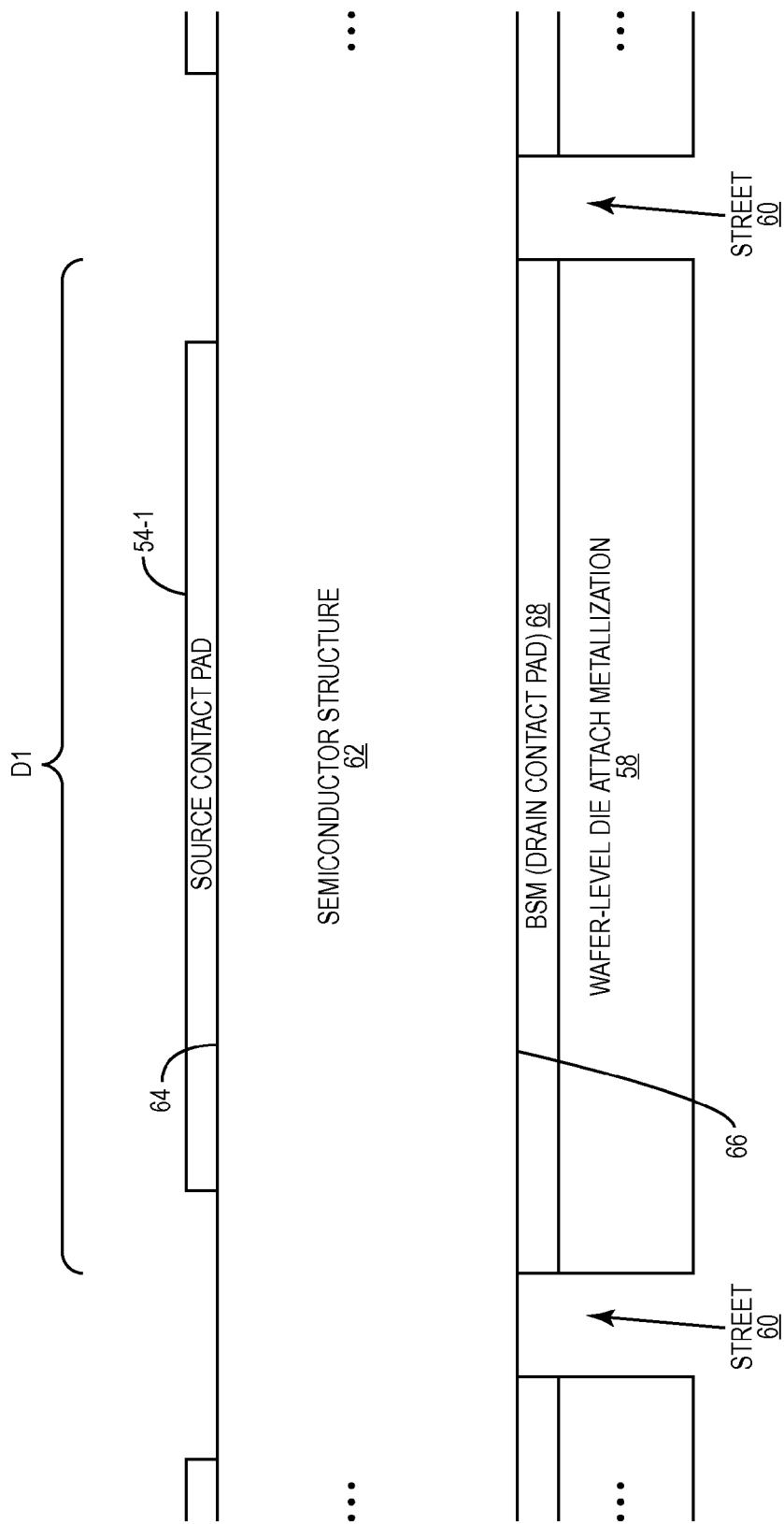
Figure 9:
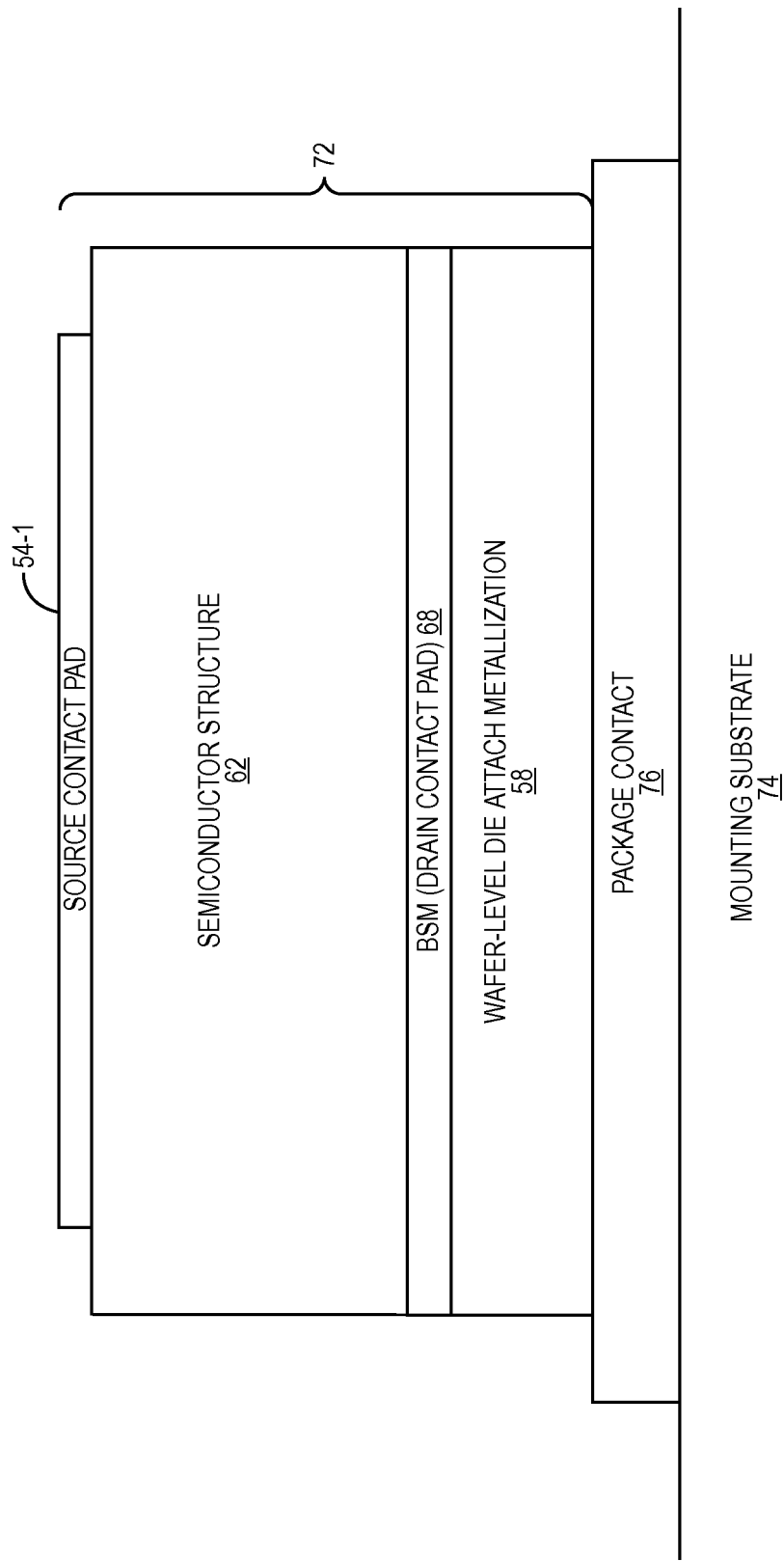

FIGS. 4A-4K graphically illustrate a process for fabricating the semiconductor wafer of FIG. 1 to provide the semiconductor die regions of FIGS. 2A, 2B, and 3 according to one embodiment of the present disclosure;

FIG. 5 illustrates mounting of a semiconductor die obtained from the semiconductor wafer of FIG. 1 after dicing according to one embodiment of the present disclosure;

FIGS. 6A and 6B illustrate a front-side and a back-side, respectively, of a subset of the semiconductor die areas of the semiconductor wafer of FIG. 1 according to another embodiment of the present disclosure;

FIG. 7 illustrates a cross-section of one of the semiconductor die regions of FIGS. 6A and 6B according to one embodiment of the present disclosure;

FIGS. 8A-8F graphically illustrate a process for fabricating the semiconductor wafer of FIG. 1 to provide the semiconductor die regions of FIGS. 6A, 6B, and 7 according to one embodiment of the present disclosure; and FIG. 9 illustrates mounting of a semiconductor die obtained from the semiconductor wafer of FIG. 1 after dicing according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In the manufacturing of semiconductor devices on semiconductor dies, vias are often used to interconnect back-side metallization and front-side metallization. One issue that arises when using a via to interconnect back-side metallization to front-side metallization is that, when soldering the semiconductor die to a mounting substrate during packaging, the solder can enter the via. More specifically, when soldering the semiconductor die to the mounting substrate, a conventional process is to place a solder preform between a contact on the mounting substrate and the back-side metallization. The solder preform is a loose block of a desired solder material. Tolerance ranges for dimensions of the solder preform are very wide. When soldering the semiconductor die to the mounting substrate, the solder preform is heated such that the solder preform transitions from a solid to either a liquid or a mixture of a liquid and a solid and a downward force is applied to the semiconductor die. As a result of the downward force and the wide tolerances of the dimensions of the solder preform, the solder can enter the via. When in the via, the solder mixes with the back-side metallization, and metal from the solder diffuses through the back-side metallization to the front-side metallization. The metal from the solder that diffuses through the back-side metallization to the front-side metallization degrades the front-side metallization and thus the performance of the semiconductor device. In particular, during manufacturing, the content of the front-side metallization is carefully controlled to provide desired characteristics (e.g., a low resistivity Schottky contact). The diffusion of metal from the solder into the front-side metallization alters the makeup of the front-side metallization and therefore degrades the performance of the semiconductor device. As such, there is a need for systems and methods for eliminating or mitigating the diffusion of solder from the back-side metallization to the front-side metallization through the via.

Embodiments of a semiconductor wafer including a wafer-level die attach metallization on a back-side of a semiconductor wafer and methods of manufacturing thereof are disclosed. In this regard, FIG. 1 illustrates a semiconductor wafer 10 according to one embodiment of the present disclosure. The semiconductor wafer 10 includes multiple semiconductor die areas (D1-D32). While in this example there are thirty-two semiconductor die areas, the semiconductor wafer 10 may include fewer semiconductor die areas or more semiconductor die areas depending on the particular implementation. Each of the semiconductor die areas (D1-D32) corresponds to a semiconductor die after dicing the semiconductor wafer 10. As discussed below, the semiconductor wafer 10 includes a wafer-level die attach metallization (not shown) on a back-side of the semiconductor wafer 10. After dicing, the wafer-level die attach metallization, rather than solder preforms, is utilized to electrically and thermally attach the resulting semiconductor dies to corresponding mounting substrates during packaging.

FIGS. 2A and 2B illustrate front-side and back-side views, respectively, of the semiconductor die areas D1-D4 of the semiconductor wafer 10 of FIG. 1 according to one embodiment of the present disclosure. Note that while FIGS. 2A and 2B illustrate only the semiconductor die areas D1-D4 for clarity and ease of discussion, it should be understood that this discussion is equally applicable to the other semiconductor die areas D5-D32 of the semiconductor wafer 10. As illustrated in FIG. 2A, in this embodiment, a lateral transistor is formed in each of the semiconductor die areas D1-D4. More specifically, in this embodiment, a lateral Field Effect Transistor (FET) is formed in each of the semiconductor die areas D1-D4. The lateral FET may be a radio frequency or microwave frequency device (e.g., a High Electron Mobility Transistor (HEMT)) or a power device (e.g., a trench Metal-Oxide Semiconductor FET (MOSFET). Since the lateral FETs are formed in the semiconductor areas D1-D4, source contact pads 12-1 through 12-4 (more generally referred to herein collectively as source contact pads 12 and individually as source contact pad 12), gate contact pads 14-1 through 14-4 (more generally referred to herein collectively as gate contact pads 14 and individually as gate contact pad 14), and drain contact pads 16-1 through 16-4 (more generally referred to herein collectively as drain contact pads 16 and individually as drain contact pad 16) are formed on a front-side of the semiconductor wafer 10 in the semiconductor die areas D1-D4, respectively. Together, the source contact pads 12, the gate contact pads 14, and the drain contact pads 16 of the semiconductor die areas D1-D32 are referred to herein as a front-side metallization of the semiconductor wafer 10. Further, each individual source contact pad 12, gate contact pad 14, and drain contact pad 16 is referred to herein as a front-side metallization element.

As illustrated in FIG. 2B, on the back-side of the semiconductor wafer 10, vias 18-1 through 18-4 (more generally referred to herein collectively as vias 18 and individually as via 18) are formed through the back-side of the semiconductor wafer 10 to the source contact pads 12-1 through 12-4, respectively. As discussed below in detail, a wafer-level die attach metallization 20 is formed on the back-side of the semiconductor wafer 10 but not within the vias 18-1 through 18-4. By forming the wafer-level die attach metallization 20 using wafer-level processing, placement and dimensions of the wafer-level die attach metallization 20 can be carefully and precisely controlled to prevent the wafer-level die attach metallization 20 from entering the vias 18-1 through 18-4, or at least substantially reducing a risk of the wafer-level die attach metallization 20 from entering the vias 18-1 through 18-4, when attaching corresponding semiconductor dies to mounting substrates after dicing the semiconductor wafer 10. This is a substantial improvement over using traditional solder preforms.

In addition, in this embodiment, streets 22 are provided through the wafer-level die attach metallization 20 and, in some embodiments, an underlying back-side metallization (not shown) to a back-side of a semiconductor structure (not shown) of the semiconductor wafer 10. The streets 22 are formed around peripheries of the semiconductor die areas D1-D4. In other words, the streets 22 are formed along desired cut-lines to be used when dicing the semiconductor wafer 10 to provide the resulting semiconductor die. The street pattern (i.e., the pattern defined by the streets 22) is beneficial because the thickness of the wafer-level die attach metallization 20 is relatively large. Cutting through this material during dicing is difficult and it can result in jagged edges, die cracks, and premature saw wear.

FIG. 3 is an illustration of a cross-section of the semiconductor die area D1 along the dashed lines illustrated in FIGS. 2A and 2B according to one embodiment of the present disclosure. As illustrated, the semiconductor wafer 10 includes a semiconductor structure 24 having a front-side 26 and a back-side 28. The details of the semiconductor structure 24 will vary depending on the particular implementation. In general, the semiconductor structure 24 includes one or more layers of the same semiconductor materials or one or more layers of different semiconductor materials. For example, for one embodiment of a HEMT formed in a Group III nitride material system, the semiconductor structure 24 includes a substrate (e.g., a Silicon Carbide (SiC) substrate), a base layer (e.g., Gallium Nitride (GaN)) on the substrate, and a barrier layer (e.g., Aluminum Gallium Nitride (AlGaN)) on the base layer. However, this is just one example. Numerous variations to the makeup of the semiconductor structure 24 will be apparent to one of ordinary skill in the art upon reading this disclosure.

The source contact pad 12-1 is on the front-side 26 of the semiconductor structure 24 along with the other front-side metallization elements (not shown). The via 18-1 extends from the back-side 28 of the semiconductor structure 24 through the semiconductor structure 24 to the source contact pad 12-1. A back-side metallization (BSM) 30 is on the back-side 28 of the semiconductor structure 24 and within the via 18-1. The back-side metallization 30 covers a terminating end 32 of the via 18-1 as well as lateral sidewalls 34 of the via 18-1. The back-side metallization 30 includes one or more metal or metal alloy layers. For example, the back-side metallization 30 may be Gold (Au) and have a thickness in the range of and including 1 to 10 microns. The portion of the back-side metallization 30 within the via 18-1 provides both an electrical and a thermal connection between the source contact pad 12-1 and the back-side metallization 30 on the back-side 28 of the semiconductor structure 24.

A first barrier layer 36 is on a portion of the back-side metallization 30 that is within the via 18-1 and on the back-side 28 of the semiconductor structure 24 around a periphery 38 of the via 18-1. The periphery 38 of the via 18-1 is preferably small such that a large portion of the back-side metallization 30 is exposed (i.e., not covered by the first barrier layer 36). Optionally, a second barrier layer 40 is on the first barrier layer 36 over the portion of the back-side metallization 30 that is within the via 18-1 and on the back-side 28 of the semiconductor structure 24 around the periphery 38 of the via 18-1. The first and, optionally, second barrier layers 36 and 40 provide either: (1) a diffusion barrier that prevents diffusion of metal from the wafer-level die attach metallization 20 into the portion of the back-side metallization 30 that is within the via 18-1 and thus prevents diffusion of metal from the wafer-level die attach metallization 20 into the source contact pad 12-1, (2) a surface tension that repels the wafer-level die attach metallization 20 away from the via 18-1 when the wafer-level die attach metallization 20 is in a liquid or liquid/solid state during attachment of the corresponding semiconductor die to a mounting substrate after dicing the semiconductor wafer 10, or (3) both (1) and (2).

The first and second barrier layers 36 and 40 can be formed of any materials or combination of materials that provide the desired diffusion barrier and/or surface tension. In particular, the first and second barrier layers 36 and 40 may be formed of one or more dielectric materials, one or more metals or metal alloys, one or more organic or inorganic composite materials, or any combination thereof. Further, a thickness of the first and second barrier layers 36 and 40 may vary depending on their functions. For instance, if the first barrier layer 36 is a diffusion barrier, the thickness of the first barrier layer 36 is preferably relatively thick. Conversely, if the second barrier layer 40 provides a desired surface tension, then the thickness of the second barrier layer 40 is not critical but should be thick enough to provide uniform coverage inside the via 18-1.

In one embodiment, the first barrier layer 36 is a solder barrier (i.e., a diffusion barrier layer). In this embodiment, the thickness of the first barrier layer 36 is in a range of and including 1000 to 5000 Angstroms and is preferably formed by Plasma Enhanced Chemical Vapor Deposition (PECVD), Atomic Layer Deposition (ALD), and/or the like. In one particular embodiment, the solder barrier includes one or more oxide layers. In another embodiment, the solder barrier includes one or more layers of Aluminum (Al), Aluminum Oxide ($Al_2O_3$), Silicon Dioxide ($SiO_2$), Silicon Nitride (SiN), Hafnium Oxide ($HfO_2$), Titanium (Ti), or Titanium Oxide ($TiO_2$). In one preferred embodiment, the dielectric solder barrier is, or includes, a layer of $SiO_2$ deposited using PECVD. In another preferred embodiment, the dielectric solder barrier is, or includes, an $Al_2O_3$ layer and a $SiO_2$ layer on the $Al_2O_3$ layer, where the $Al_2O_3$ layer is formed using ALD and the $SiO_2$ layer is formed using PECVD or ALD.

The semiconductor wafer 10 includes the wafer-level die attach metallization 20 on the back-side metallization 30 other than the portion of the back-side metallization 30 that is within the via 18-1 and on the back-side 28 of the semiconductor structure 24 around the periphery 38 of the via 18-1. The wafer-level die attach metallization 20 includes one or more layers of the same or different metals or metal alloys that are suitable for attaching the semiconductor dies to mounting substrates during packaging by soldering or frictional force. In one preferred embodiment, the wafer-level die attach metallization 20 is a low melting point metal alloy and, even more preferably, a low melting point eutectic mixture of a desired metal alloy. In one preferred embodiment, the wafer-level die attach metallization 20 is low melting point eutectic mixture of Gold-Tin (AuSn), which is an approximately 80% Au and approximately 20% Sn mixture. Preferably, the mixture is 80% Au and 20% Sn, but the mixture may vary slightly while remaining sufficiently near the eutectic mixture to maintain a suitably low melting point. As an example, the mixture may have a percentage of Au in a range of and including 75% to 85% and a percentage of Sn in a range of and including 15% to 25%, or more preferably a percentage of Au in the range of and including 78% to 82% and a percentage of Sn in a range of and including 18% to 22%, or even more preferably a percentage of Au in a range of and including 79% to 81% and a percentage of Sn in a range of and including 19% to 21%.

A thickness of the wafer-level die attach metallization 20 may vary depending on the particular implementation. In general, the thickness of the wafer-level die attach metallization 20 should be thick enough to provide a continuous interface free of voids and account for a roughness of the mounting substrate to which the corresponding semiconductor die is to be mounted while remaining thin enough to keep from spilling over into the via 18-1 when melted during attachment of the corresponding semiconductor die to the mounting substrate. In one particular non-limiting implementation, the thickness of the wafer-level die attach metallization 20 is in a range of and including 10 to 20 micrometers, but may be thicker or thinner depending on factors such as, for instance, the roughness of the mounting substrate, the material used for the wafer-level die attach metallization 20, and a force applied to the semiconductor die during attachment to the mounting substrate.

Lastly, the semiconductor wafer 10 includes the streets 22. In this embodiment, the streets 22 are through both the wafer-level die attach metallization 20 and the back-side metallization 30. However, in one alternative embodiment, the streets 22 pass through the wafer-level die attach metallization 20 but not the back-side metallization 30.

Figure 4A:
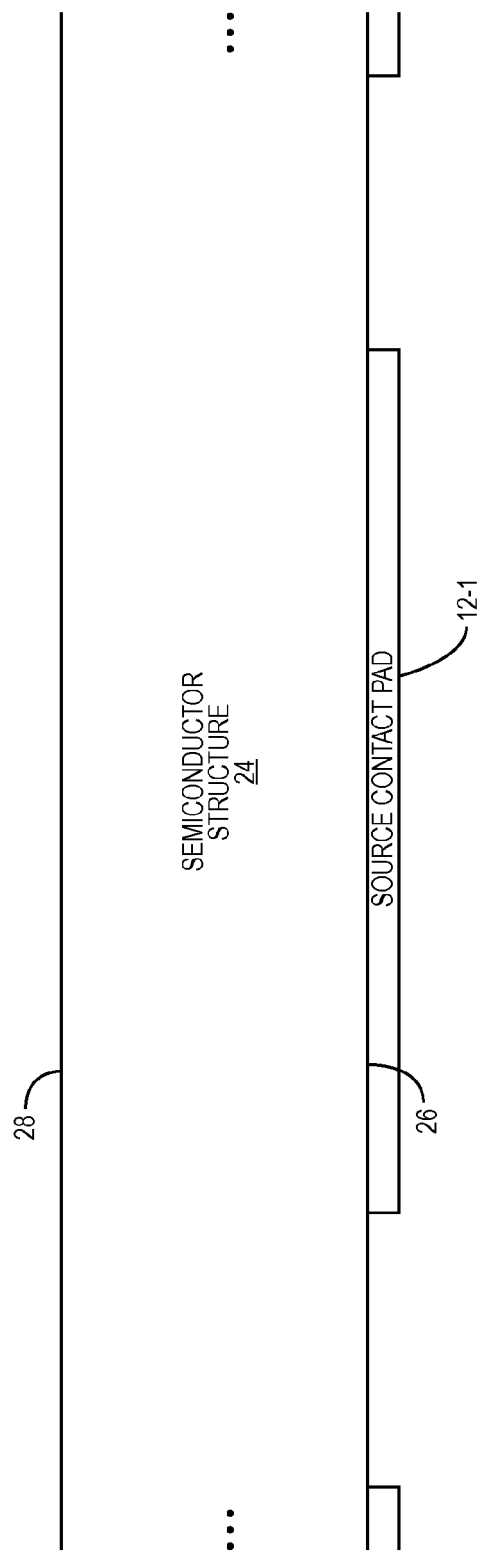
Figure 4B:
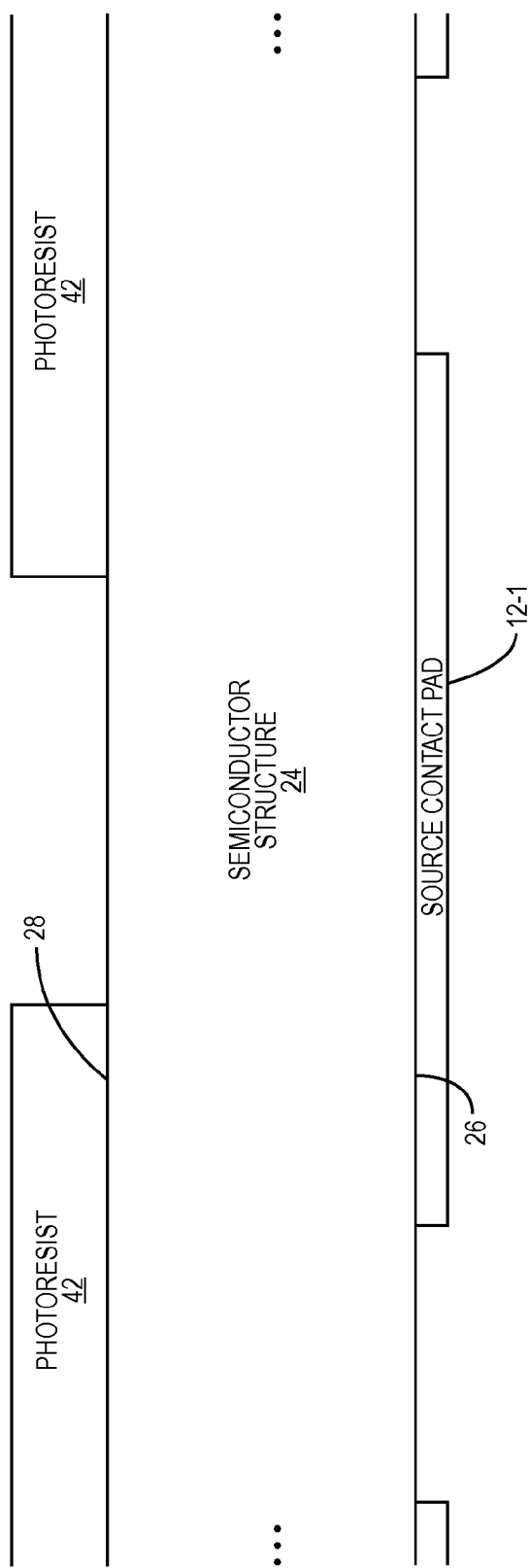
Figure 4C:
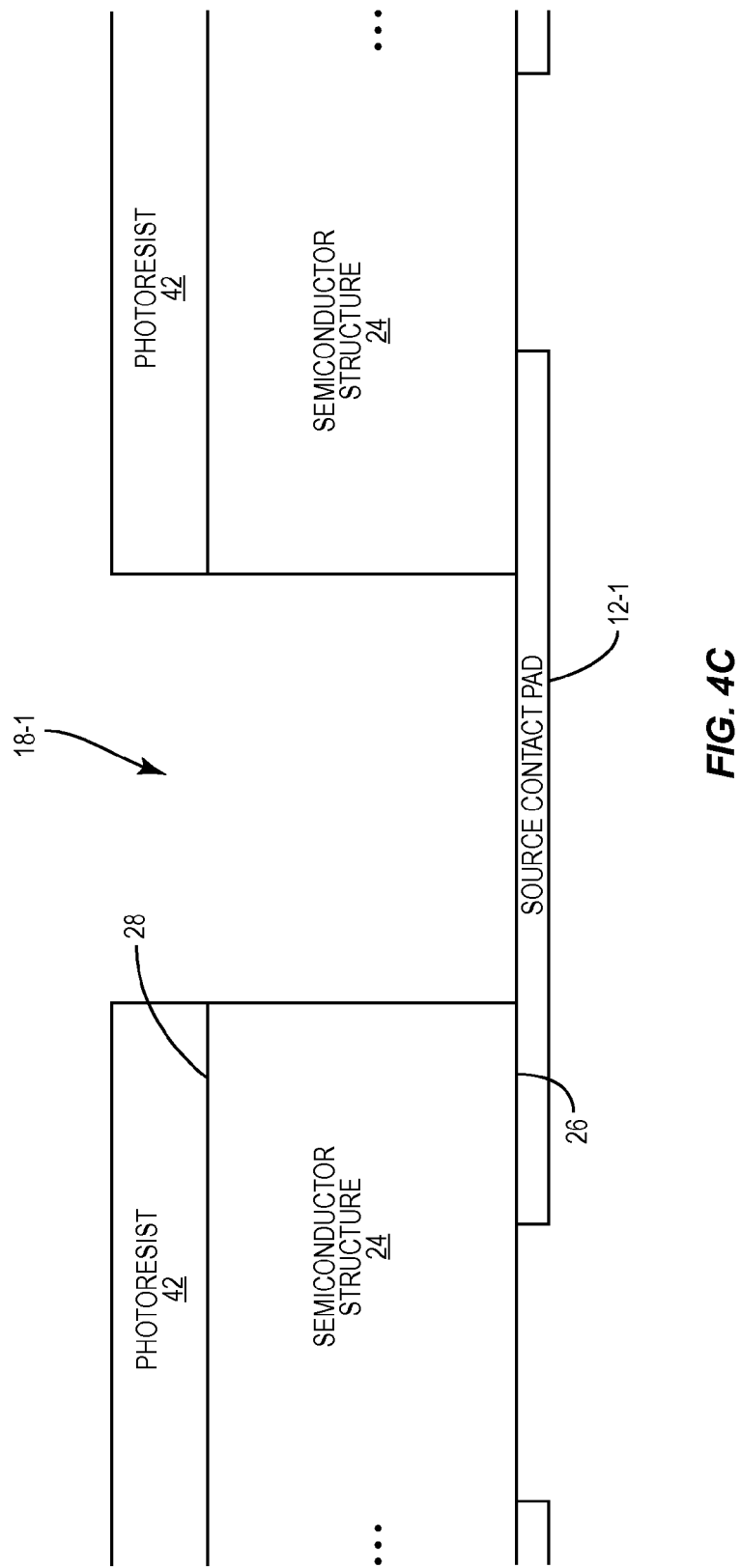

FIGS. 4A-4K graphically illustrate a process for fabricating the semiconductor wafer 10 as described above with respect to FIGS. 1, 2A, 2B, and 3 according to one embodiment of the present disclosure. Note that while only the cross-section of the semiconductor die area D1 of FIG. 3 is illustrated in FIGS. 4A-4K for clarity, the process is described below in general terms as a process for fabricating the semiconductor wafer 10. First, as illustrated in FIG. 4A, the semiconductor wafer 10 including the semiconductor structure 24 and the front-side metallization is provided. Again, in this embodiment, the front-side metallization includes the source contact pad 12-1 for the lateral FET formed in the semiconductor die area D1 as illustrated in FIG. 4A as well as the source contact pads 12 for the lateral FETs formed in the other semiconductor die areas D2-D32. Next, as illustrated in FIG. 4B, a photoresist layer 42 is formed on the back-side 28 of the semiconductor structure 24 and patterned to expose a portion of the back-side 28 of the semiconductor structure 24 where the via 18-1 is to be formed. Likewise, the patterning of the photoresist layer 42 exposes portions of the back-side 28 of the semiconductor structure 24 where the other vias 18 are to be formed. Next, the semiconductor structure 24 is etched using the photoresist layer 42 as a mask to form the via 18-1, as illustrated in FIG. 4C. Again, while not illustrated, the etching also forms the other vias 18. The vias 18 extend from the back-side 28 of the semiconductor structure 24 to the corresponding source contact pads 12 on the front-side 26 of the semiconductor structure 24.

Figure 4D:
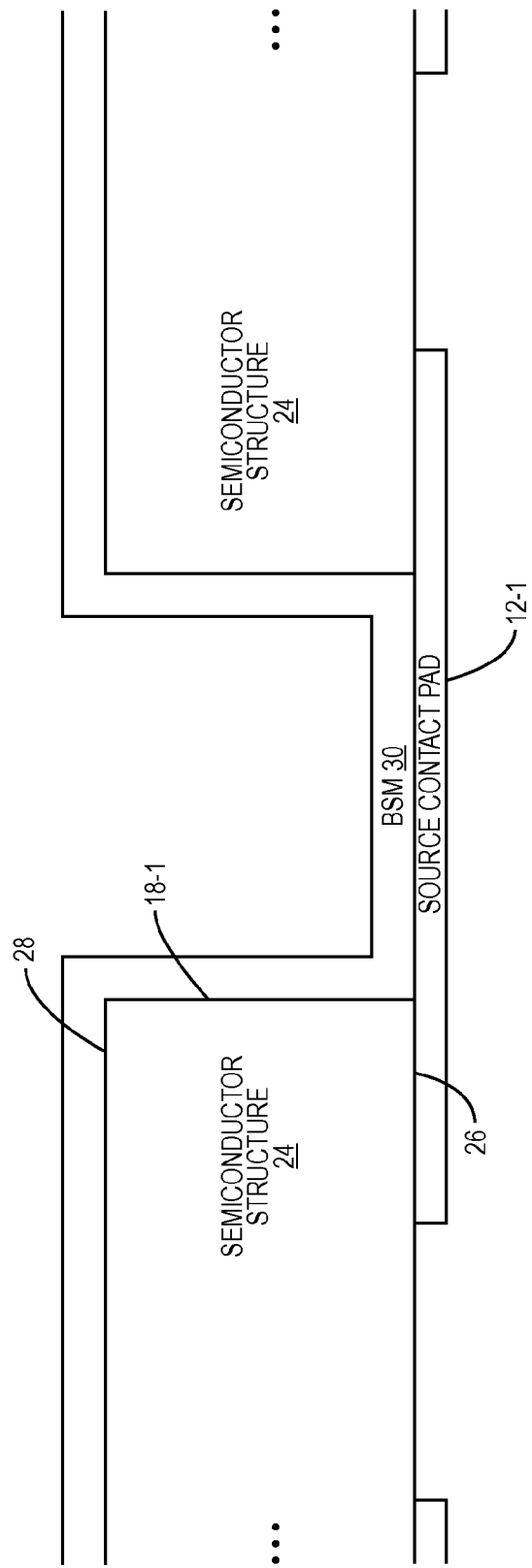

After etching the vias 18, the back-side metallization 30 is formed on the back-side 28 of the semiconductor structure 24 and within the vias 18 as illustrated in FIG. 4D with respect to the via 18-1. The back-side metallization 30 may be formed by plating, sputtering, or otherwise forming a desired metal(s) or metal alloy(s) on the back-side 28 of the semiconductor structure 24 and within the vias 18. Notably, if plating is used, a seed metal or metal alloy may first be sputtered or otherwise deposited on the back-side 28 of the semiconductor structure 24 and within the via 18. The desired metal(s) or metal alloy(s) can then be plated on the seed metal or metal alloy. Through the vias 18, the back-side metallization 30 creates an electrical and thermal contact to the corresponding source contact pads 12.

Figure 4E:
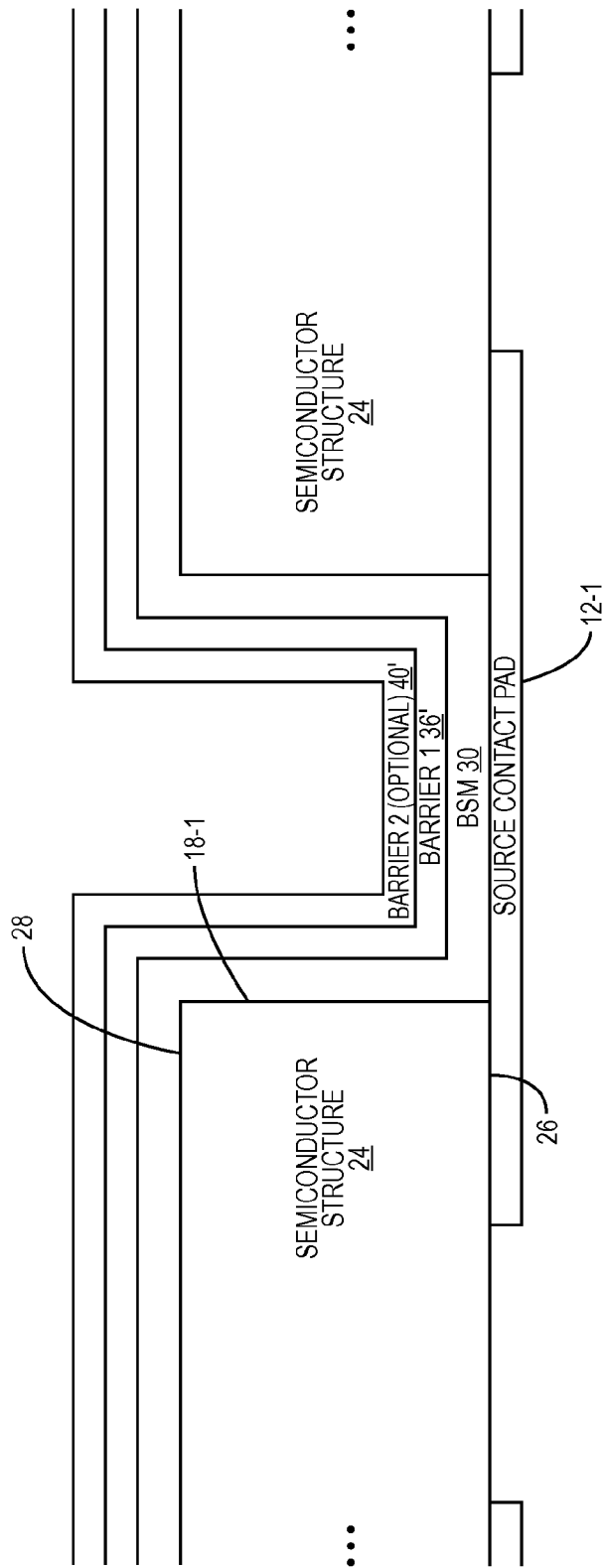

Next, a first barrier material 36' and, optionally, a second barrier material 40' are formed on the back-side metallization 30 as illustrated in FIG. 4E. The first barrier material 36' is the material from which the first barrier layer 36 is formed. Likewise, the second barrier material 40' is the material from which the second barrier layer 40 is formed. As discussed above, the first barrier material 36' and the second barrier material 40' may each be formed by one or more layers of dielectric materials, one or more layers of metals or metal alloys, and/or one or more layers of organic or inorganic composite materials.

Figure 4F:
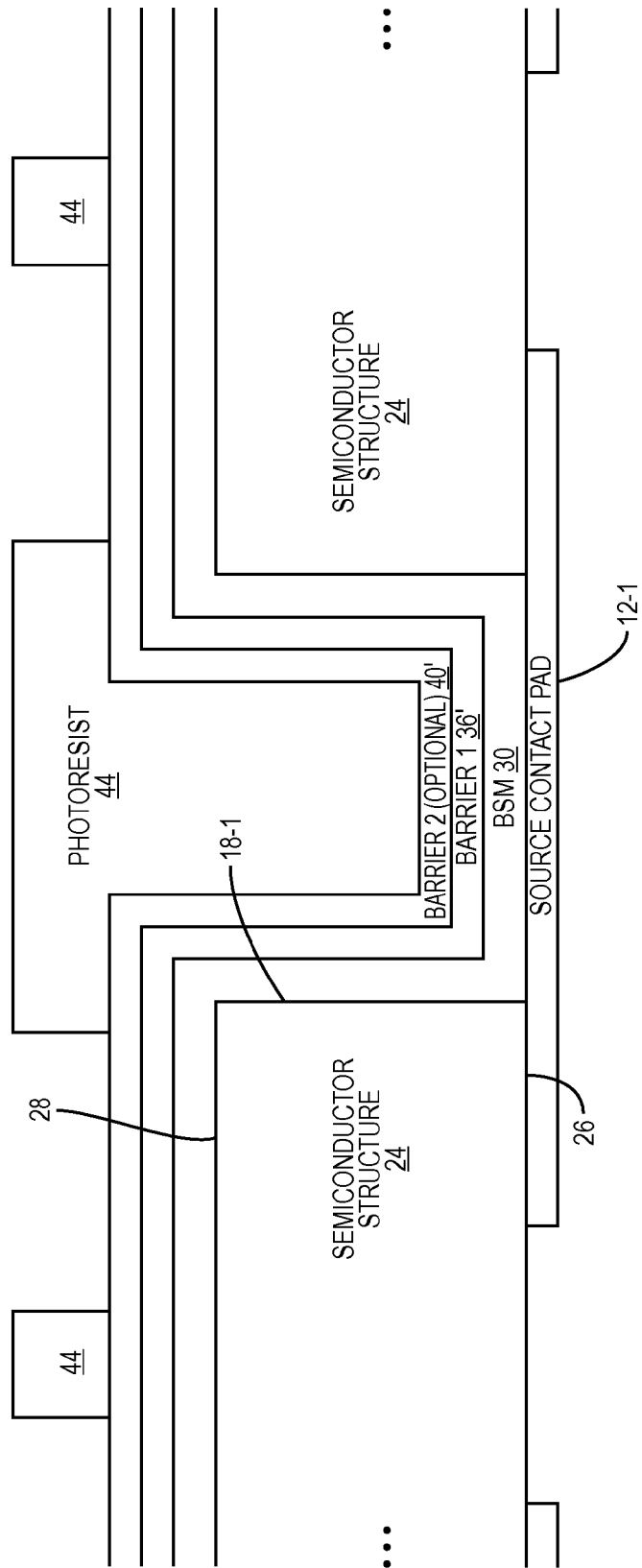
Figure 4G:
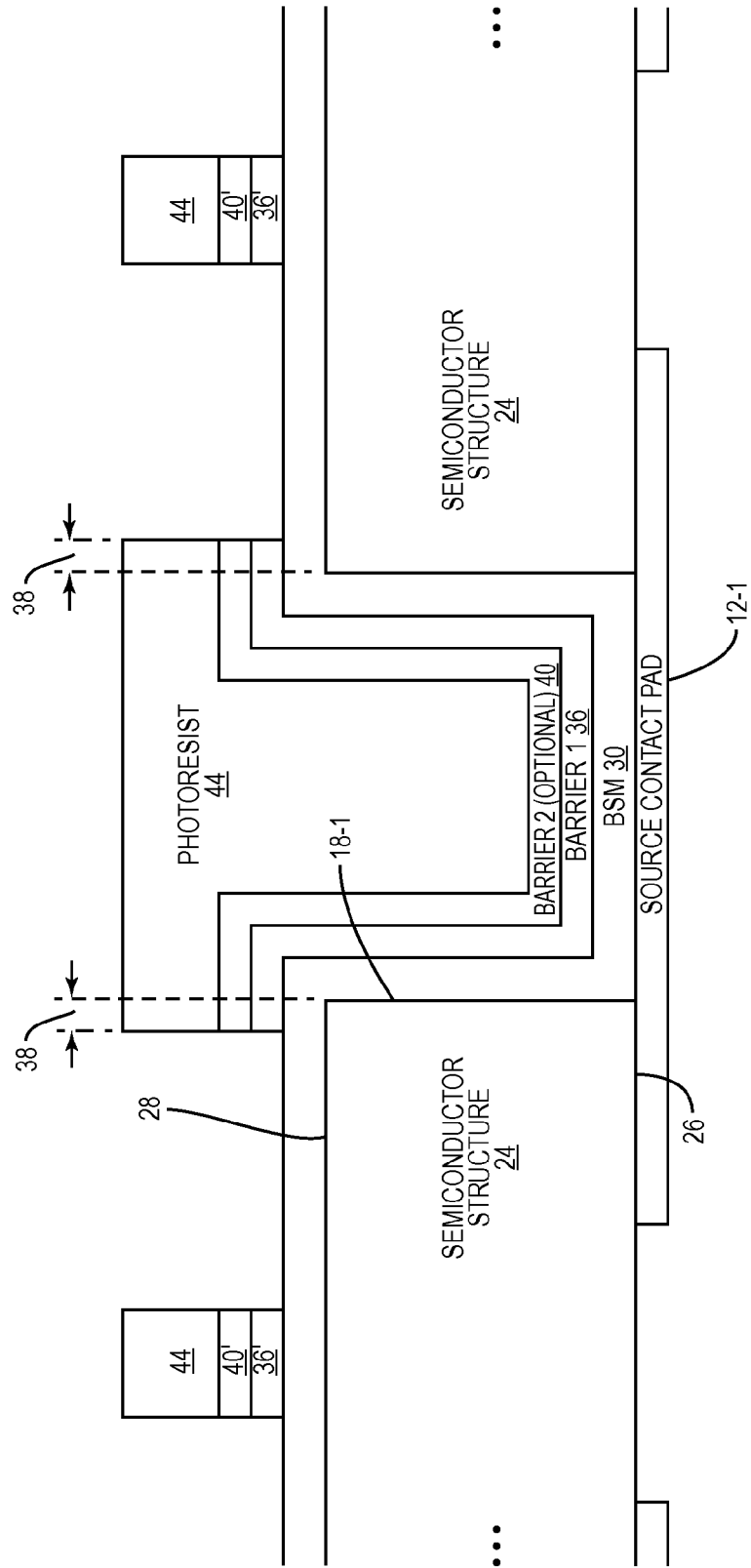

After forming the first and, optionally, second barrier materials 36' and 40', a photoresist layer 44 is formed on the first and second barrier materials 36' and 40' and patterned to define areas of the first and second barrier materials 36' and 40' to be etched to form the first and second barrier layers 36 and 40, as illustrated in FIG. 4F. In addition, in this embodiment, the photoresist layer 44 is also patterned to cover desired locations of the streets 22. As discussed below, the photoresist layer 44 prevents the wafer-level die attach metallization 20 from forming at the desired locations of the streets 22. Next, as illustrated in FIG. 4G, the first and second barrier materials 36' and 40' are etched using the photoresist layer 44 as a mask to thereby form the first and second barrier layers 36 and 40. Again, the first and second barrier layers 36 and 40 are on the portion of the back-side metallization 30 that is within the vias 18 and around the peripheries 38 of the vias 18. Also, in this embodiment, residual portions of the first and second barrier materials 36' and 40' remain under the photoresist layer 44 in the areas of the streets 22.

Figure 4H:
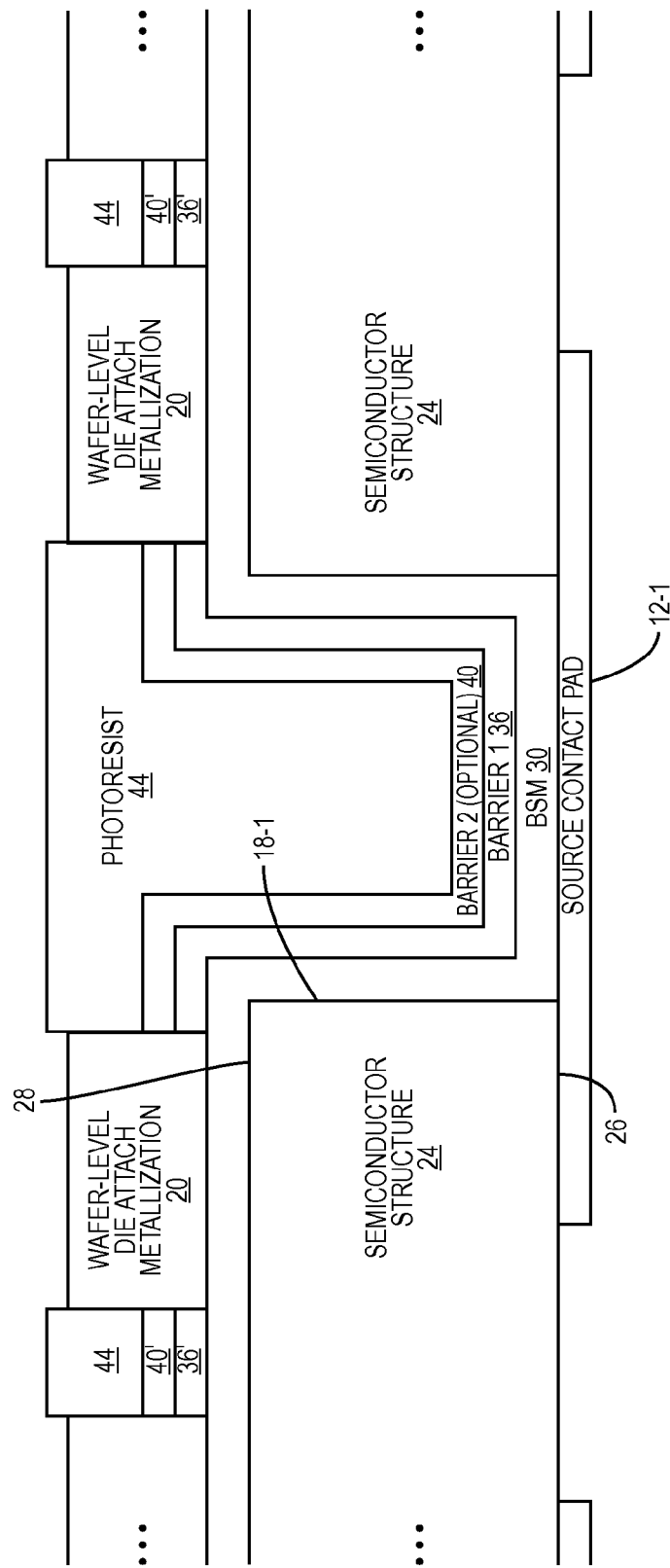

After etching the first and second barrier materials 36' and 40', the photoresist layer 44 is again used as a mask for forming the wafer-level die attach metallization 20 as illustrated in FIG. 4H. In this embodiment, the wafer-level die attach metallization 20 is plated, and the photoresist layer 44 prevents plating of the wafer-level die attach metallization 20 within the vias 18 and around the peripheries 38 of the vias 18. In addition, the photoresist layer 44 prevents plating of the wafer-level die attach metallization 20 in the desired locations of the streets 22. In one embodiment, the wafer-level die attach metallization 20 is plated as a desired mixture of desired metal alloy. Preferably, the desired mixture is a low melting point eutectic mixture of a desired metal alloy. In one particular embodiment, the low melting point eutectic mixture is an approximately 80% Au and approximately 20% Sn AuSn mixture or, more preferably, a 80% Au and 20% Sn AuSn mixture. Note that a 80% Au and 20% Sn AuSn mixture is only one example of a low melting point eutectic mixture. Other low melting point eutectic mixtures may alternatively be used.

In another embodiment, rather than plating a mixture of a desired metal alloy, the wafer-level die attach metallization 20 may be formed by plating or otherwise forming an alternating series of a first metal and a second metal. For example, the alternating series may include a first layer of Au, a second layer of Sn, and a third layer of Au where thicknesses of the three layers are controlled such that, when heated, the Au and Sn layers intermix to provide a desired mixture of AuSn. This mixture is preferably a low melting point eutectic mixture, which for AuSn is a mixture of 80% Au and 20% Sn. It should also be noted that the three layer structure (Au/Sn/Au) is only an example. More layers may be used (e.g., Au/Sn/Au/Sn/Au/Sn/Au . . . ). Using more layers may provide improved intermixing of the two metals. Again, while Au and Sn are used in the examples above, other metals may be used to provide other desired metal alloys.

Figure 4I:
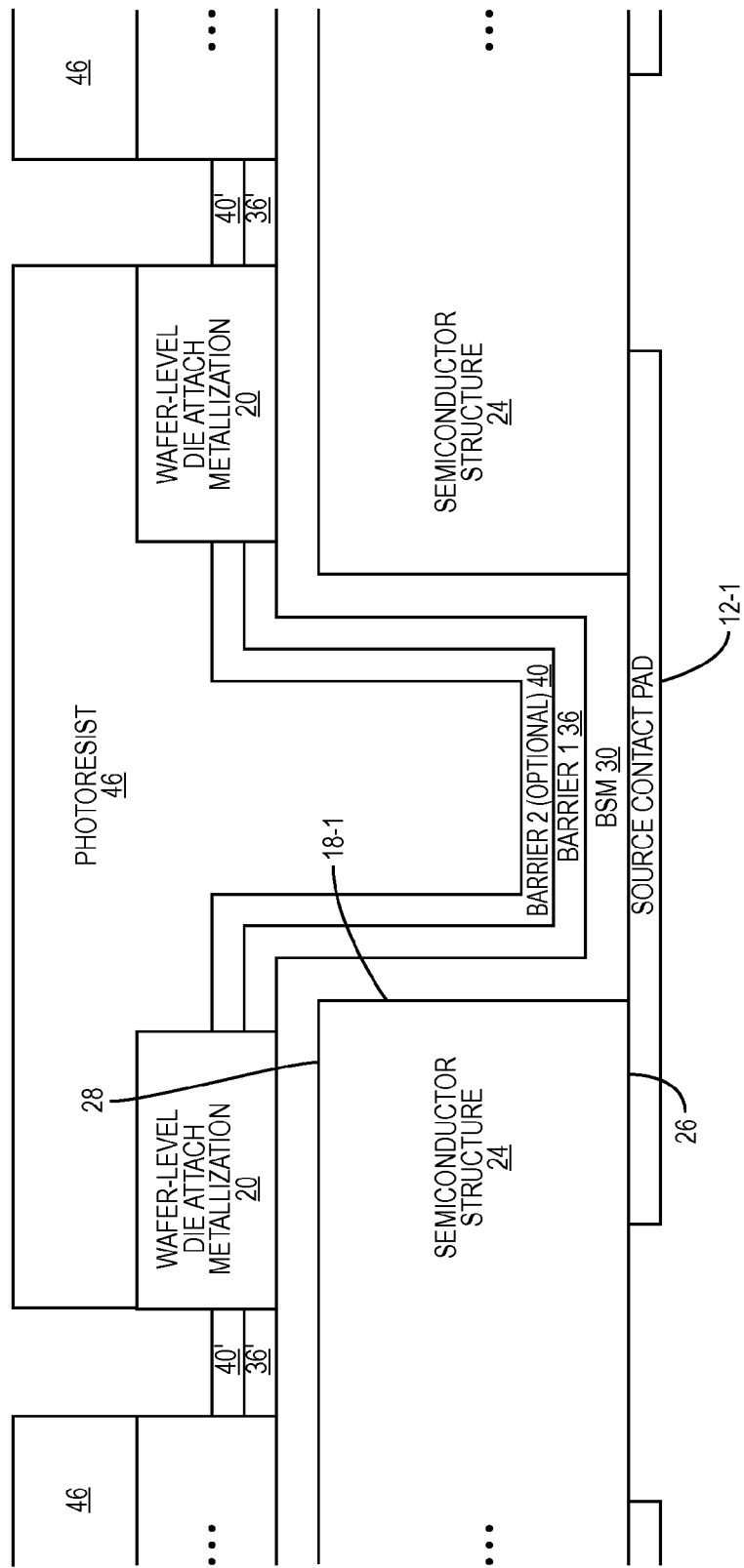
Figure 4J:
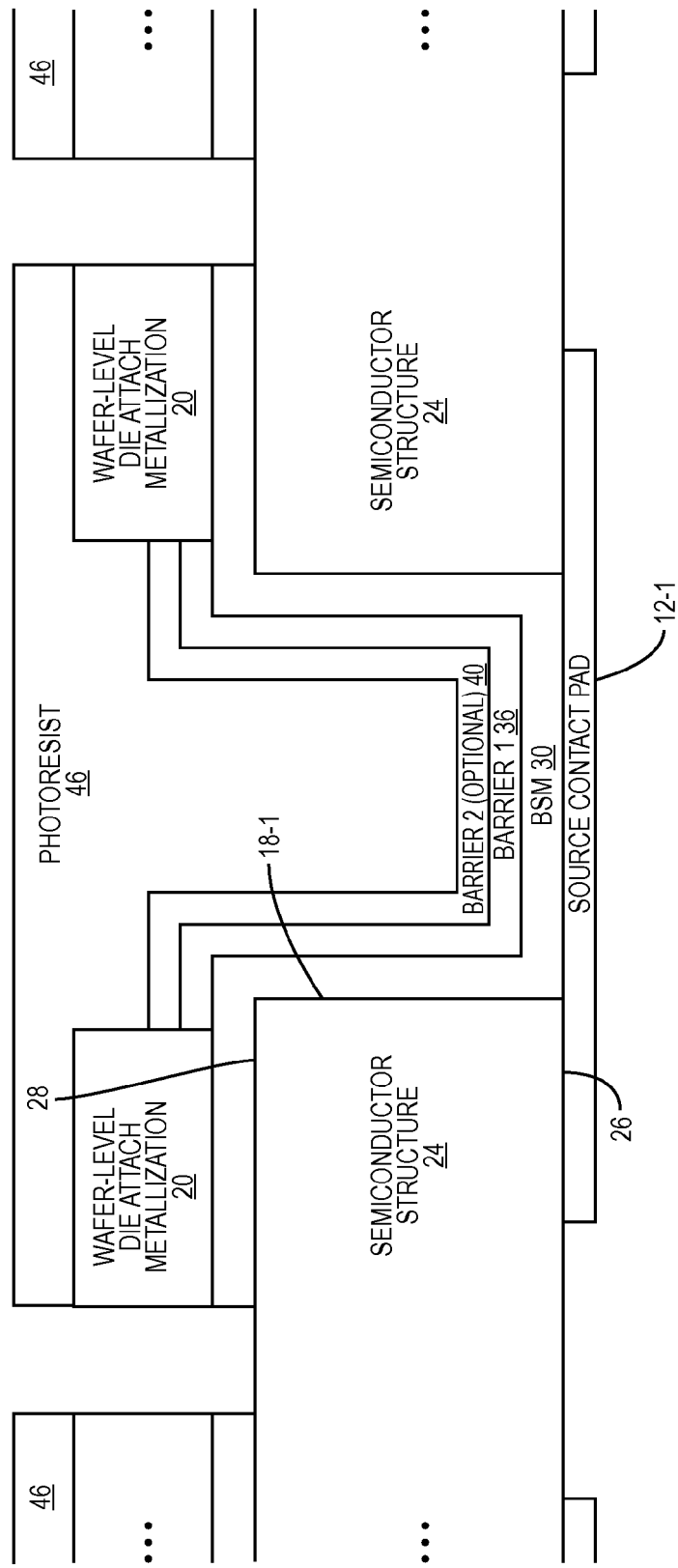
Figure 4K:
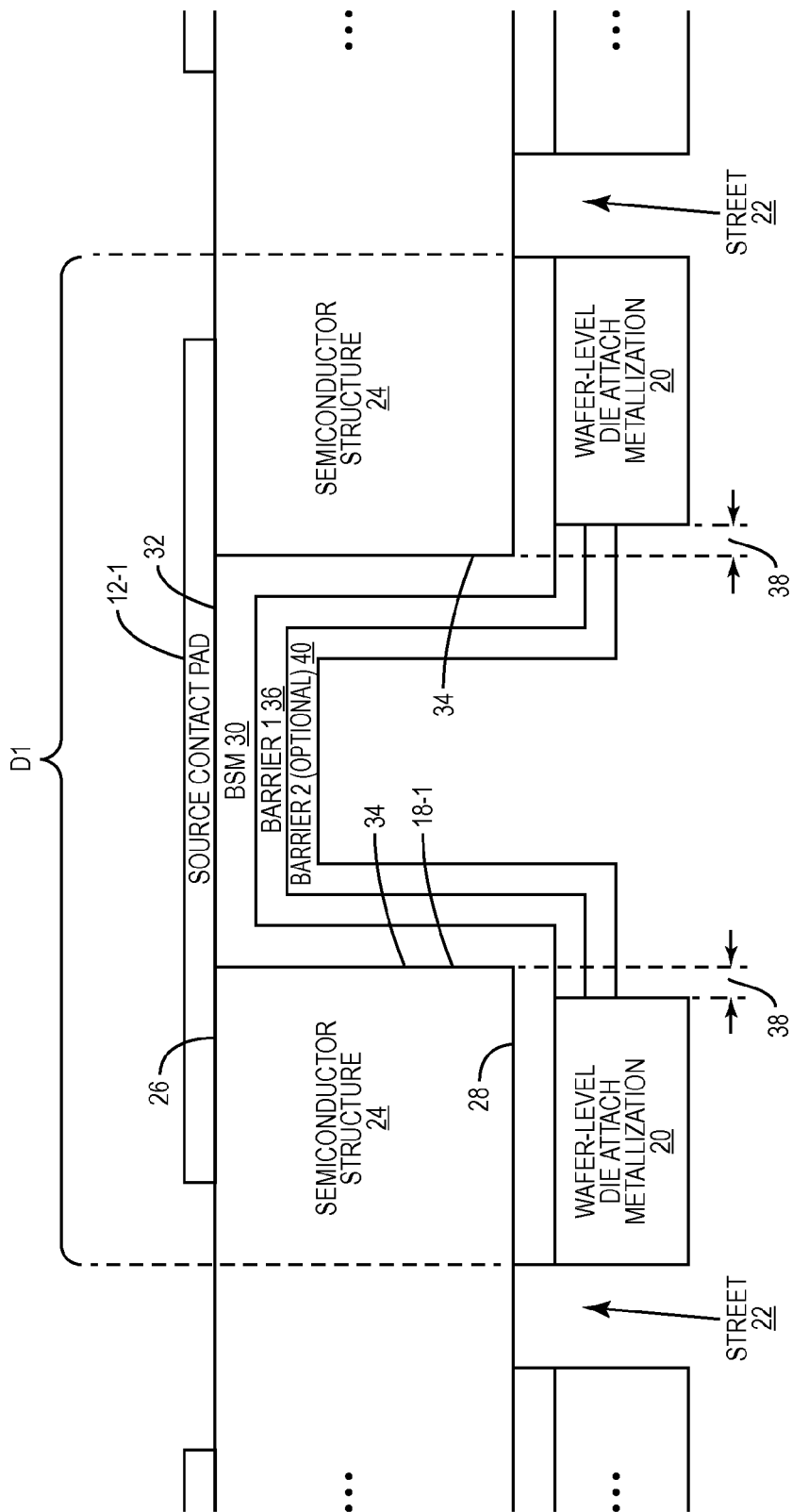

The photoresist layer 44 is then removed and, optionally, a photoresist layer 46 is then formed and patterned as illustrated in FIG. 4I. The photoresist layer 46 exposes the desired locations of the streets 22. Next, as illustrated in FIG. 4J, the residual portions of the first and second barrier materials 36' and 40' as well as the back-side metallization 30 are etched using the photoresist layer 46 as a mask to thereby provide the streets 22. Lastly, the photoresist layer 46 is removed as illustrated in FIG. 4K. Note that in an alternative embodiment, the step of etching the residual portions of the first and second barrier materials 36' and 40' and the back-side metallization 30 illustrated in FIG. 4J may be skipped such that the streets 22 pass through the wafer-level die attach metallization 20 but not the residual portions of the first and second barrier materials 36' and 40' and the back-side metallization 30 as illustrated in FIG. 4I.

After fabricating the semiconductor wafer 10, the semiconductor wafer 10 is diced into a number of semiconductor dies. Each of the semiconductor dies corresponds to one of the semiconductor die areas (D1-D32) of the semiconductor wafer 10 illustrated in FIG. 1. FIG. 5 illustrates attachment of a semiconductor die 48 obtained after dicing the semiconductor wafer 10 onto a mounting substrate 50 during packaging of the semiconductor die 48 according to one embodiment of the present disclosure. As illustrated, the semiconductor die 48 is positioned on a package contact 52 on the mounting substrate 50 such that the wafer-level die attach metallization 20 is directly on the package contact 52. In one embodiment, the wafer-level die attach metallization 20 is a solder material (e.g., a low melting point eutectic mixture of a desired metal alloy such as AuSn), and the semiconductor die 48 is electrically and thermally attached, or connected, to the mounting substrate 50 by heating the wafer-level die attach metallization 20 and applying a force on the semiconductor die 48 toward the mounting substrate 50 and/or a force on the mounting substrate 50 toward the semiconductor die 48. When using conventional solder preforms, the solder flows into the via 18-1 during the attachment process. In contrast, the placement and the dimensions of the wafer-level die attach metallization 20 can be carefully controlled during wafer-level processing such that the wafer-level die attach metallization 20 does not enter the via 18-1 or at least the risk of the wafer-level die attach metallization 20 entering the via 18-1 is substantially reduced. In addition, the first and second barrier layers 36 and 40 provide an additional diffusion barrier and/or surface tension barrier with respect to the wafer-level die attach metallization 20. While in the embodiment discussed above soldering is used to attach the semiconductor die 48 to the mounting substrate 50, attachment of the semiconductor die 48 to the mounting substrate 50 may be provided by other means such as, for example, force.

While the discussion above focuses on an embodiment where each semiconductor die area (D1-D32) of the semiconductor die 10 is used to form a lateral FET, the present disclosure is not limited thereto. In this regard, FIGS. 6A-9 illustrate embodiments in which a vertical device (e.g., a vertical MOSFET) is formed in each of the semiconductor die areas (D1-D32). More specifically, FIGS. 6A and 6B illustrate front-side and back-side views, respectively, of the semiconductor die areas D1-D4 of the semiconductor wafer 10 of FIG. 1 according to another embodiment of the present disclosure. Note that while FIGS. 6A and 6B illustrate only the semiconductor die areas D1-D4 for clarity and ease of discussion, it should be understood that this discussion is equally applicable to the other semiconductor die areas D5-D32 of the semiconductor wafer 10. As illustrated in FIG. 6A, in this embodiment, a vertical transistor is formed in each of the semiconductor die areas D1-D4. More specifically, in this embodiment, a vertical FET is formed in each of the semiconductor die areas D1-D4. The vertical FET may, in one embodiment, be a power device. Since the vertical transistors are formed in the semiconductor die areas D1-D4, source contact pads 54-1 through 54-4 (more generally referred to herein collectively as source contact pads 54 and individually as source contact pad 54) and gate contact pads 56-1 through 56-4 (more generally referred to herein collectively as gate contact pads 56 and individually as gate contact pad 56) are formed on a front-side of the semiconductor wafer 10 in the semiconductor die areas D1-D4, respectively. Together, the source contact pads 54 and the gate contact pads 56 of the semiconductor die areas D1-D32 are referred to herein as a front-side metallization of the semiconductor wafer 10. Further, each individual source contact pad 54 and gate contact pad 56 is referred to herein as a front-side metallization element.

As illustrated in FIG. 6B, on a back-side of the semiconductor wafer 10, a wafer-level die attach metallization 58 is formed on the back-side of the semiconductor wafer 10. The wafer-level die attach metallization 58 and, more specifically, a back-side metallization underlying the wafer-level die attach metallization 58 serves as drains of the vertical FETs. By forming the wafer-level die attach metallization 58 using wafer-level processing, placement and dimensions of the wafer-level die attach metallization 58 can be carefully and precisely controlled. This is a substantial improvement over using traditional solder preforms.

In addition, in this embodiment, streets 60 are formed through, or in, the wafer-level die attach metallization 58 and, in some embodiments, an underlying back-side metallization (not shown) to a back-side of a semiconductor structure (not shown) of the semiconductor wafer 10. The streets 60 are formed around peripheries of the semiconductor die areas D1-D4. In other words, the streets 60 are formed along desired cut-lines to be used when dicing the semiconductor wafer 10 to provide the resulting semiconductor die. The street pattern (i.e., the pattern defined by the streets 60) is beneficial because the thickness of the wafer-level die attach metallization 58 is relatively large. Cutting through this material during dicing is difficult and it can result in jagged edges, die cracks, and premature saw wear.

FIG. 7 is an illustration of a cross-section of the semiconductor die area D1 along the dashed lines illustrated in FIGS. 6A and 6B according to one embodiment of the present disclosure. As illustrated, the semiconductor wafer 10 includes a semiconductor structure 62 having a front-side 64 and a back-side 66. The details of the semiconductor structure 62 will vary depending on the particular implementation. In general, the semiconductor structure 62 includes one or more layers of the same semiconductor materials or one or more layers of different semiconductor materials. For example, for one embodiment of a vertical MOSFET, the semiconductor structure 62 includes multiple layers of SiC or other suitable semiconductor material. However, this is just one example. Numerous variations to the makeup of the semiconductor structure 62 will be apparent to one of ordinary skill in the art upon reading this disclosure. The source contact pad 54-1 is on the front-side 64 of the semiconductor structure 62 along with the other front-side metallization elements (not shown). A back-side metallization 68 is on the back-side 66 of the semiconductor structure 62 and serves as the drain of the vertical FET. The back-side metallization 68 includes one or more metal or metal alloy layers. For example, the back-side metallization 68 may be Au and have a thickness in the range of and including 1 to 10 microns.

The wafer-level die attach metallization 58 is on the back-side metallization 68. The wafer-level die attach metallization 58 includes one or more layers of the same or different metals or metal alloys that are suitable for attaching the semiconductor dies to mounting substrates during packaging by soldering or frictional force. In one preferred embodiment, the wafer-level die attach metallization 58 is a low melting point metal alloy and, even more preferably, a low melting point eutectic mixture of a desired metal alloy. In one preferred embodiment, the wafer-level die attach metallization 58 is low melting point eutectic mixture of AuSn, which is an approximately 80% Au and approximately 20% Sn mixture. Preferably, the mixture is 80% Au and 20% Sn, but the mixture may vary slightly while remaining sufficiently near the eutectic mixture to maintain a suitably low melting point. As an example, the mixture may have a percentage of Au in a range of and including 75% to 85% and a percentage of Sn in a range of and including 15% to 25%, or more preferably a percentage of Au in the range of and including 78% to 82% and a percentage of Sn in a range of and including 18% to 22%, or even more preferably a percentage of Au in a range of and including 79% to 81% and a percentage of Sn in a range of and including 19% to 21%. A thickness of the wafer-level die attach metallization 58 may vary depending on the particular implementation. In general, the thickness of the wafer-level die attach metallization 58 is preferably thick enough to provide a continuous interface free of voids and account for a roughness of the mounting substrate to which the corresponding semiconductor die is to be mounted.

Lastly, the semiconductor wafer 10 includes the streets 60. In this embodiment, the streets 60 are through both the wafer-level die attach metallization 58 and the back-side metallization 68. However, in one alternative embodiment, the streets 60 pass through the wafer-level die attach metallization 58 but not the back-side metallization 68.

FIGS. 8A-8F graphically illustrate a process for fabricating the semiconductor wafer 10 as described above with respect to FIGS. 1, 6A, 6B, and 7 according to one embodiment of the present disclosure. Note that while only the cross-section of the semiconductor die area D1 of FIG. 7 is illustrated in FIGS. 8A-8F for clarity, the process is described below in general terms as a process for fabricating the semiconductor wafer 10. First, as illustrated in FIG. 8A, the semiconductor wafer 10 including the semiconductor structure 62 and the front-side metallization is provided. Again, in this embodiment, the front-side metallization includes the source contact pad 54-1 for the vertical FET formed in the semiconductor die area D1 as illustrated in FIG. 8A as well as the source contact pads 54 for the vertical FETs formed in the other semiconductor die areas D2-D32. Next, as illustrated in FIG. 8B, the back-side metallization 68 is formed on the back-side 66 of the semiconductor structure 62. The back-side metallization 68 may be formed by plating, sputtering, or otherwise forming a desired metal (s) or metal alloy(s) on the back-side 66 of the semiconductor structure 62. Notably, if plating is used, a seed metal or metal alloy may first be sputtered or otherwise deposited on the back-side 66 of the semiconductor structure 62. The desired metal(s) or metal alloy(s) can then be plated on the seed metal or metal alloy.

Next, the wafer-level die attach metallization 58 is formed on the back-side metallization 68 as illustrated in FIG. 8C. In one embodiment, the wafer-level die attach metallization 58 is plated onto the back-side metallization 68. In one preferred embodiment, the wafer-level die attach metallization 58 is plated as a desired mixture of desired metal alloy. Preferably, the desired mixture is a low melting point eutectic mixture of a desired metal alloy. In one particular embodiment, the low melting point eutectic mixture is an approximately 80% Au and approximately 20% Sn AuSn mixture or, more preferably, a 80% Au and 20% Sn AuSn mixture. Note that a 80% Au and 20% Sn AuSn mixture is only one example of a low melting point eutectic mixture. Other low melting point eutectic mixtures may alternatively be used.

In another embodiment, rather than plating a mixture of a desired metal alloy, the wafer-level die attach metallization 58 may be formed by plating or otherwise forming an alternating series of a first metal and a second metal. For example, the alternating series may include a first layer of Au, a second layer of Sn, and a third layer of Au where thicknesses of the three layers are controlled such that, when heated, the Au and Sn layers intermix to provide a desired mixture of AuSn. This low mixture is preferably a low melting point eutectic mixture, which for AuSn is a mixture of 80% Au and 20% Sn. It should also be noted that the three layer structure (Au/Sn/Au) is only an example. More layers may be used (e.g., Au/Sn/Au/Sn/Au/Sn/Au . . . ). Using more layers may provide improved intermixing of the two metals. Again, while Au and Sn are used in the examples above, other metals may be used to provide other desired metal alloys.

In this embodiment, after forming the wafer-level die attach metallization 58, a photoresist layer 70 is formed on the wafer-level die attach metallization 58 and patterned to expose the wafer-level die attach metallization 58 at desired locations of the streets 60, as illustrated in FIG. 8D. The wafer-level die attach metallization 58 and the back-side metallization 68 are then etched using the photoresist layer 70 as a mask to thereby form the streets 60, as illustrated in FIG. 8E. Lastly, the photoresist layer 70 is removed as illustrated in FIG. 8F.

In an alternative embodiment, the streets 60 pass through the wafer-level die attach metallization 58 but not the back-side metallization 68 such that, in FIG. 8F for example, the back-side metallization 68 would extend laterally across the streets 60. In order to form the streets 60 in this manner, in one alternative embodiment, a photoresist layer (not shown) is formed on the back-side metallization 68 prior to forming the wafer-level die attach metallization 58. This photoresist layer is patterned to cover the desired locations of the streets 60 while otherwise exposing the back-side metallization 68. The wafer-level die attach metallization 58 is then formed using the photoresist layer as a mask such that the wafer-level die attach metallization 58 is formed on the back-side metallization 68 other than at the desired locations of the streets 60. For example, the wafer-level die attach metallization 58 may be plated such that the wafer-level die attach metallization 58 is formed on the back-side metallization 68 which acts as a seed layer but is unable to be formed on the photoresist layer over the desired locations for the streets 60 because the photoresist layer is not a suitable seed material for the plating process. In this manner, the wafer-level die attach metallization 58 is formed in such a manner that the streets 60 are provided through the wafer-level die attach metallization 58 to the back-side metallization 68.

Again, after fabricating the semiconductor wafer 10, the semiconductor wafer 10 is diced into a number of semiconductor dies. Each of the semiconductor dies corresponds to one of the semiconductor die areas (D1-D32) of the semiconductor wafer 10 illustrated in FIG. 1. FIG. 9 illustrates attachment of a semiconductor die 72 obtained by dicing the semiconductor wafer 10 of FIGS. 1 and 6A-7 to a mounting substrate 74 during packaging of the semiconductor die 72 according to one embodiment of the present disclosure. As illustrated, the semiconductor die 72 is positioned on a package contact 76 on the mounting substrate 74 such that the wafer-level die attach metallization 58 is directly on the package contact 76. In one embodiment, the wafer-level die attach metallization 58 is a solder material (e.g., a low melting point eutectic mixture of a desired metal alloy such as AuSn), and the semiconductor die 72 is electrically and thermally attached, or connected, to the mounting substrate 74 by heating the wafer-level die attach metallization 58 and applying a force on the semiconductor die 72 toward the mounting substrate 74 and/or a force on the mounting substrate 74 toward the semiconductor die 72. While in the embodiment discussed above soldering is used to attach the semiconductor die 72 to the mounting substrate 74, attachment of the semiconductor die 72 to the mounting substrate 74 may be provided by other means such as, for example, force.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing a semiconductor wafer comprising a plurality of semiconductor die areas, comprising:
   forming a plurality of vias through a semiconductor structure of the semiconductor wafer from a back-side of the semiconductor structure to corresponding front-side metallization elements of the plurality of semiconductor die areas on a front-side of the semiconductor structure;
   forming a back-side metallization on the back-side of the semiconductor structure and within the plurality of vias such that, for each via of the plurality of vias, a portion of the back-side metallization is within the via and around a periphery of the via;
   for each via of the plurality of vias, providing one or more barrier layers on the portion of the back-side metallization that is within the via and around the periphery of the via;
   forming a wafer-level die attach metallization on the back-side metallization other than the portions of the back-side metallization that are within the plurality of vias and around the peripheries of the plurality of vias; and
   forming streets through the wafer-level die attach metallization around peripheries of the plurality of semiconductor die areas.

2. The method of claim 1 wherein providing the one or more barrier layers for each via of the plurality of vias comprises:
   forming one or more barrier materials on the back-side metallization including the portions of the back-side metallization that are within the plurality of vias and around the peripheries of the plurality of vias;
   forming a mask on portions of the one or more barrier materials that are on the portions of the back-side metallization that are within the plurality of vias and around the peripheries of the plurality of vias; and
   etching the one or more barrier materials using the mask to thereby provide the one or more barrier layers for each of the plurality of vias.

3. The method of claim 2 wherein forming the wafer-level die attach metallization comprises forming the wafer-level die attach metallization on a portion of the back-side metallization exposed by the mask after etching the one or more barrier materials.

4. The method of claim 1 further comprising cutting the semiconductor wafer along the streets to thereby dice the semiconductor wafer to provide a plurality of semiconductor dies.

5. The method of claim 1 wherein forming the wafer-level die attach metallization comprises plating the wafer-level die attach metallization on the back-side metallization other than the portions of the back-side metallization that are within the plurality of vias and around the peripheries of the plurality of vias.

6. The method of claim 5 wherein plating the wafer-level die attach metallization comprising plating a low melting point eutectic mixture of a desired metal alloy on the back-side metallization other than the portions of the back-side metallization that are within the plurality of vias and around the peripheries of the plurality of vias.

7. The method of claim 6 wherein the low melting point eutectic mixture of the desired metal alloy is an approximately 80%, 20% mixture of Gold-Tin (AuSn).

8. The method of claim 1 wherein forming the wafer-level die attach metallization comprises forming an alternating series of one or more layers of a first metal in a desired metal alloy and one or more layers of a second metal in the desired metal alloy such that, when heated, the one or more layers of the first metal and the one or more layers of the second metal mix to provide a low melting point eutectic mixture of the desired metal alloy.

* * * * *